US005936455A

United States Patent [19]

Kobayashi et al.

[11] Patent Number: 5,936,455

[45] **Date of Patent: *Aug. 10, 1999**

[54] MOS INTEGRATED CIRCUIT WITH LOW POWER CONSUMPTION

[75] Inventors: Souichi Kobayashi; Yukihiko Shimazu; Toshio Kishi, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/611,087

[22] Filed: Mar. 5, 1996

[30] Foreign Application Priority Data

| | | | |
|---|---|---|---|
| Jun. 26, 1995 | [JP] | Japan | 7-159685 |
| Dec. 25, 1995 | [JP] | Japan | 7-337473 |

[51] Int. Cl.$^{6}$ .......... H01L 27/00

[52] U.S. Cl. .......... 327/437; 327/530; 327/538; 327/541; 327/543

[58] Field of Search .......... 327/333, 437, 327/530, 538, 540, 541, 544, 545, 546, 427, 434, 436; 326/80, 81, 82, 83, 33, 34; 365/227

[56] References Cited

U.S. PATENT DOCUMENTS

| | | | |
|---|---|---|---|
| 4,804,865 | 2/1989 | Clark, II | 327/541 |
| 4,837,460 | 6/1989 | Uchida | 327/437 |
| 5,198,699 | 3/1993 | Hashioto et al. | 327/437 |
| 5,220,205 | 6/1993 | Shigehara et al. | 327/546 |
| 5,568,085 | 10/1996 | Eitan et al. | 327/546 |

FOREIGN PATENT DOCUMENTS

| | | | |
|---|---|---|---|
| 454135 A2 | 10/1991 | European Pat. Off. | 327/437 |
| 2-5616 | 1/1990 | Japan | 327/437 |
| 5-299983 | 11/1993 | Japan | 327/333 |

OTHER PUBLICATIONS

Electronic Circuits by Schilling et al. 1989, pp. 152–154.

T. Gabara, "Pulsed Power Supply CMOS–PPS CMOS", *1994 IEEE Symposium On Low Power Electronics*, 1994, pp. 98 & 99.

*Primary Examiner*—Tuan T. Lam
*Attorney, Agent, or Firm*—Burns, Doane, Swecker & Mathis, LLP

[57] ABSTRACT

A MOS integrated circuit comprising a middle potential node to which a middle potential is to be supplied, a first operation circuit operating between a first potential and the middle potential, a second operation circuit operating between the middle potential and a second potential, and a node stabilization circuit for stabilizing the potential of the middle potential node.

36 Claims, 34 Drawing Sheets

MOS INTEGRATED CIRCUIT WITH LOW POWER CONSUMPTION

BACKGROUND OF THE INVENTION

1. Field of the Invention

The present invention relates to a MOS (Metal Oxide Semiconductor) integrated circuit (hereinafter referred to as "MOS-IC") of a multilevel power supply system, wherein a source potential is divided into a plurality of levels to operate an independent circuit at each level.

2. Description of Related Art

Generally, a conventional MOS-IC is supplied with a source potential having a single level from Outside and performs full-swing operation on the basis of the source potential. In some of MOS-ICs, the source potential having a single level applied from outside is stepped down internally to reduce power consumption.

FIG. 1 is a circuit diagram showing an example of a power supply circuit in a conventional MOS-IC, and an inverter is shown in this case. The inverter has a structure, wherein the drain of a P-channel transistor (hereinafter referred to as "P-ch Tr") 2801 is connected to the drain of an N-channel transistor (hereinafter referred to as "N-ch Tr") 2802, source voltage Vcc is applied to the source of the P-ch Tr 2801, and the source of the N-ch Tr 2802 is grounded. To the output node of the inverter, which is the connecting point of the drains, a load capacitor 2803 the one terminal of which is set at ground potential Gnd is connected. In this inverter, either of the transistors turns on depending on input signals applied to the gates of both transistors, and the source potential Vcc or the ground potential Gnd is outputted. At this time, the load capacitor 2803 is charged or discharged.

As shown in this example, in the power supply system of the conventional MOS-IC, when the output of the inverter rises and falls, the load capacitor 2803 connected to the output node thereof is charged or discharged. Power is consumed by this single pair of rising and falling operations.

Since the power supply circuit of the conventional MOS-IC is structured as described above, electrical charges flow to the ground side when discharge occurs at the gate, thereby causing the problem of consuming significant power.

SUMMARY OF THE INVENTION

The present invention has been devised to solve the above-mentioned problem. The one object of the invention is to provide a MOS-IC requiring low power consumption by efficiently reusing electrical charges discharged from the gate.

The MOS-IC of the invention comprises a middle potential node to which a middle potential is to be applied, a first operation circuit which operates at a potential between a first potential and the middle potential, a second operation circuit which operates at a potential between the middle potential and a second potential, a node stabilization circuit for stabilizing the potential at the middle potential node. At the middle potential node, charge and discharge may be offset by each other and replenishment of electrical charges may be sometimes unnecessary, in this case the power is not consumed by the amount of the offset. In the node stabilization circuit, the fluctuation of the potential at the middle potential node, which is generated when charge and discharge are not offset completely, is stabilized by removing (discharging) or replenishing (charging) the electrical charges at the middle potential node.

In the node stabilization circuit, discharge is performed at the middle potential node when the middle potential is higher than a reference potential, and charge is performed at the middle potential node when the middle potential is lower than the reference potential. As a result, the middle potential is stabilized to be the reference potential.

When a plurality of middle potential nodes are provided and a middle potential is applied from outside, it is made possible that the middle potential node on the first potential side and the middle potential node oil the second potential side do not exert any effect on each other, with a middle potential node to which the middle potential is to be applied from outside positioned therebetween.

When first and second reference potential nodes are provided, and charge and discharge are performed at the middle potential node on the basis of a different reference potential, unnecessarily excessively sensitive reaction can be prevented.

The reference potential may be generated by voltages divided by the resistance ratios of resistors disposed internally or may be applied from outside. When applied from outside, the reference potential can be adjusted easily. Even the problem of an operation margin can be solved.

The influence of the fluctuation of the first and second potentials on the middle potential can be reduced by connecting a capacitor to the middle potential node. The influence of the fluctuation of the first and second potentials on the reference potential can be reduced by connecting a capacitor to the reference potential node.

The MOS-IC of the invention is advantageous in that its drive capability is stabilized and increased, and leak current is reduced by applying the first potential to the substrate of the P-channel transistor and by applying the second potential to the substrate of the N-channel transistor, the transistors being included in the first and second operation circuits. In addition, the transistors can be laid out easily.

The first operation circuit and the second operation circuit can be used differently as described below.

A clock signal oscillating between the first potential and the second potential is level-converted into a signal oscillating between the first potential and the middle potential by the first operation circuit, and the clock signal is also level-converted into a signal oscillating between the middle potential and the second potential by the second operation circuit. These clock signals are shifted from each other by a half period. These signals are then level-converted to signals oscillating between the first potential and the second potential. Since each of the two circuits is driven by a voltage of waveform inverted from each other, the currents flowing in the two circuits are offset by each other, and the power consumption at the time of clock signal distribution can be reduced. At this time, it is desired that the drive capability of the clock buffer circuit of the first circuit is equal to that of the corresponding clock buffer circuit of the second circuit. In addition, the load capacity parasitic on the wires for the clock buffer circuit of the first circuit can be made equal to that parasitic on the wires for the corresponding clock buffer circuit of the second circuit by placing the clock buffer circuits adjacent to each other. In this case, since the clock buffer circuits operate at the same timing, any delay due to wire resistance hardly occurs at the time of electrical charge supply to the middle potential node.

Furthermore, a function block of a multi-bit structure is assigned to the first and second operation circuits. The function block can be applied to bus drivers, memory, datapath section, etc. In the bus driver, drivers for driving large capacitors cause switching simultaneously. The currents flowing in the drivers are offset by each other, thereby reducing power consumption. When the function block is applied to memory, the standby currents flowing in memory devices which are not accessed are offset by each other. When the function block is used as a datapath section, any delay due to wire resistance hardly occurs, thereby reducing power consumption.

The delay due to wire resistance at the time of supplying electrical charges to the middle potential node more hardly occurs by alternately arranging the bit portions to be assigned to the first and second operation circuits and by positioning the middle potential wires at the boundary of the bit portions.

A substrate potential of a transistor whose source receives the middle potential, and which is included in above-mentioned operation circuit may be switched to a plurality of arbitrary potentials by a substrate potential supply circuit which receives a signal inputted from outside. In this case, when a substrate of a transistor in one operation circuit is at the middle potential, a substrate of a transistor in the other operation circuit is also at the middle potential.

To put it concretely, a second substrate potential supply circuit supplies the middle potential to a substrate of a P-channel transistor whose source receives the middle potential, and which is included in a second operation circuit when the first substrate potential supply circuit supplies the middle potential to a substrate of the N-channel transistor whose source receives the middle potential, and which is included in a first operation circuit. A second substrate potential supply circuit supplies the first potential to the substrate of the P-channel transistor when the first substrate potential supply circuit supplies the second potential to the substrate of the N-channel transistor. Hence the invention can deal with each operational situation such as large or small of the leak current, and high or low of operational speed according to the substrate potential. That is, when the transistor is to operate at high speed, the substrate potential can be set at an arbitrary potential, and when the transistor is to operate at low speed, the voltage between the substrate and gate of the transistor is set to be large, thereby decreasing the leak current.

The above and further objects and features of the invention will more fully be apparent from the following detailed description with accompanying drawings.

DESCRIPTION OF THE PREFERRED EMBODIMENTS

The present invention will be described in detail referring to the accompanying drawings showing the embodiments thereof.

Embodiment 1

Figure 1:
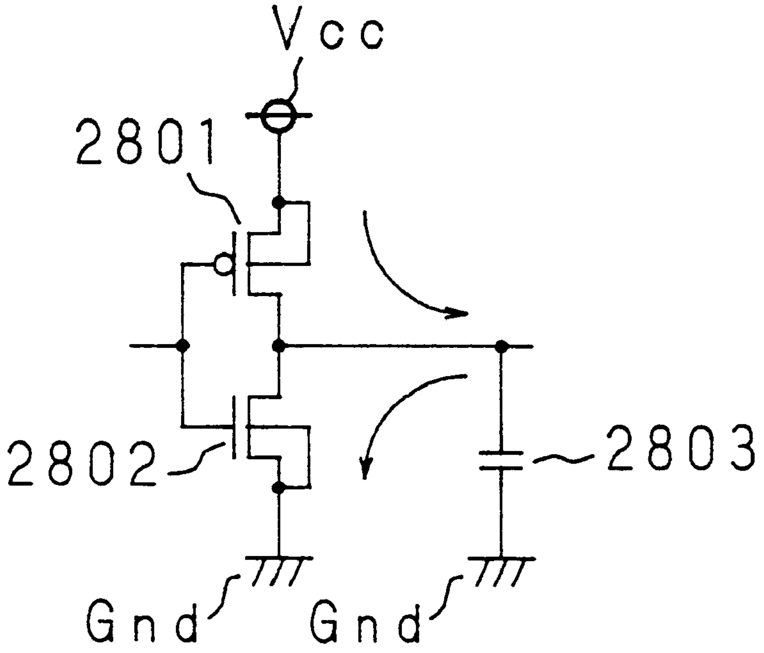
FIG. 1 PRIOR ART
FIG. 1 is a block diagram explaining a power supply system of a conventional MOS-IC.
Figure 2:
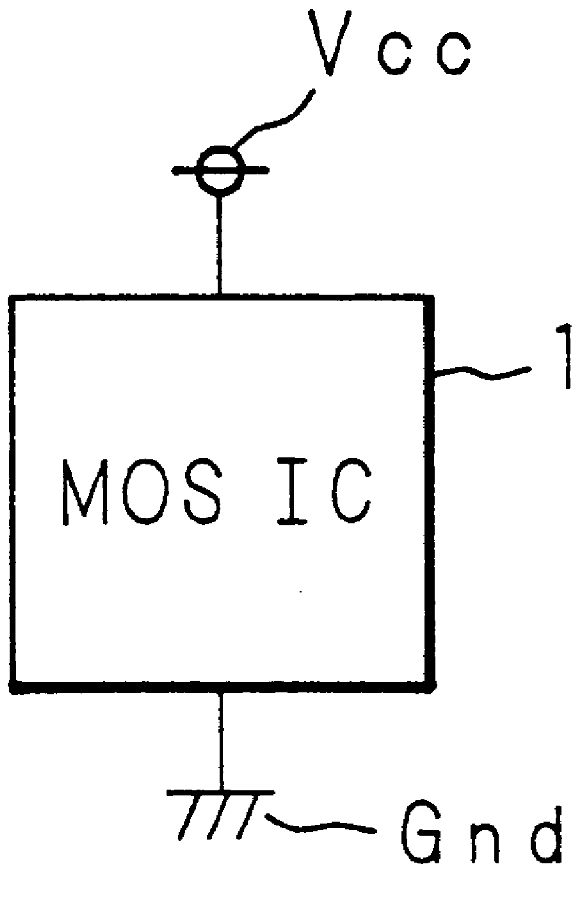
FIG. 2 is a block diagram showing the structure of a MOS-IC according to embodiment 1 of the present invention.

FIG. 2 is a block diagram showing the structure of a MOS integrated circuit (MOS-IC) of the invention. A MOS-IC 1 of a multilevel power supply system is connected between a power source Vcc and the ground Gnd. The power source Vcc applies a single level source potential Vcc. The ground potential is denoted with Gnd.

Figure 3:
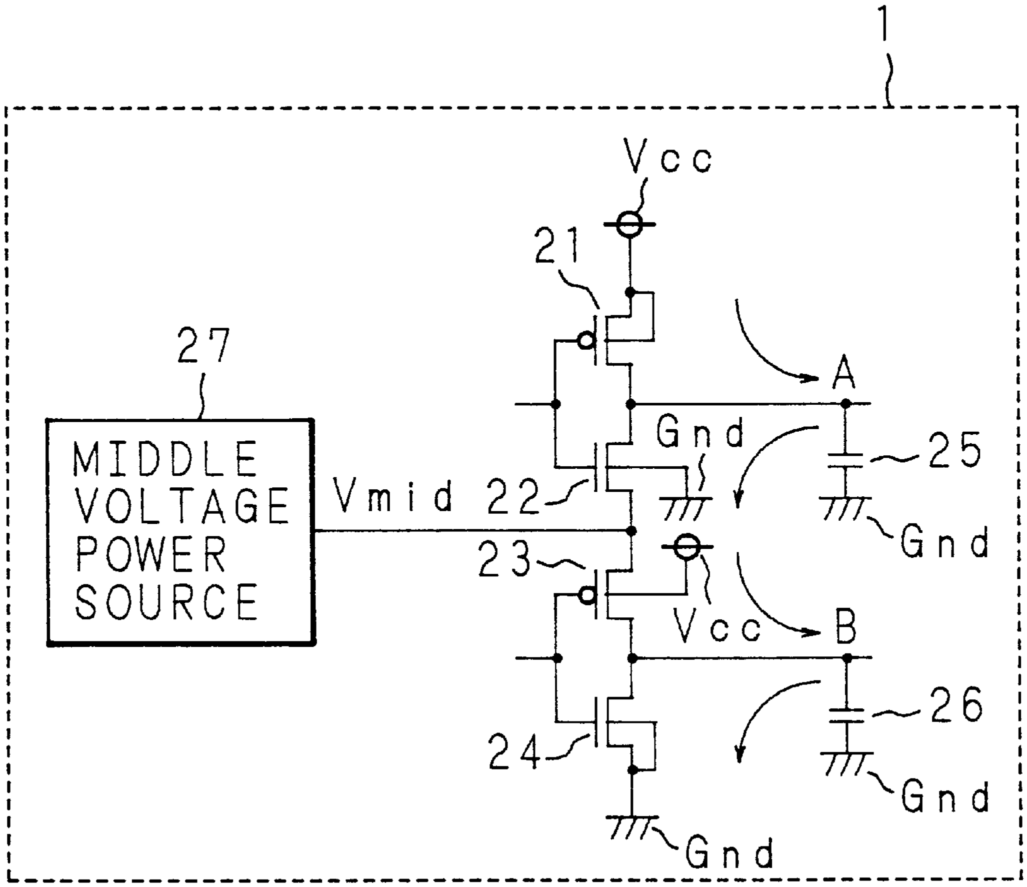
FIG. 3 is a block diagram explaining the power supply system of the MOS-IC of the invention.

FIG. 3 is a block diagram explaining the power supply system of the MOS-IC 1. The drain of a P-channel transistor (hereinafter referred to as "P-ch Tr") 21 is connected to the drain of an N-channel transistor (hereinafter referred to as "N-ch Tr") 22, and the source of the P-ch Tr 21 is connected to the power source Vcc. The drain of a P-ch Tr 23 is connected to the drain of an N-ch Tr 24, and the source of the N-ch Tr 24 is grounded. In these inverters, the source of the N-ch Tr 22 is connected to the source of the P-ch Tr 23.

The connection node of the N-ch Tr 22 and the P-ch Tr 23 is, for example, connected to the output terminal of a middle voltage power source 27 which outputs a middle potential Vmid, a half of the source potential Vcc, and the output is used as a middle voltage node. The source potential Vcc is applied to the substrates of the P-ch Trs 21 and 23. The substrates of the N-ch Trs 22 and 24 are grounded. A parasitic load capacitor 25 is present at connection node A (the output node of the inverter) of the P-ch Tr 21 and the N-ch Tr 22. A parasitic load capacitor 26 is present at connection node B of the P-ch Tr 23 and the N-ch Tr 24.

The inverter comprising the P-ch Tr 21 and the N-ch Tr 22 is an example of a first operation circuit, and a single inverter is shown representatively to simplify the circuit. This inverter operates at the upper level in the range of the source potential Vcc to the middle potential Vmid. On the other hand, the inverter comprising the P-ch Tr 23 and the N-ch Tr 24 is an example of a second operation circuit, and a single inverter is shown representatively to simplify the circuit. This inverter operates at the lower level in the range of the middle potential Vmid to the ground potential Gnd.

Figure 4:
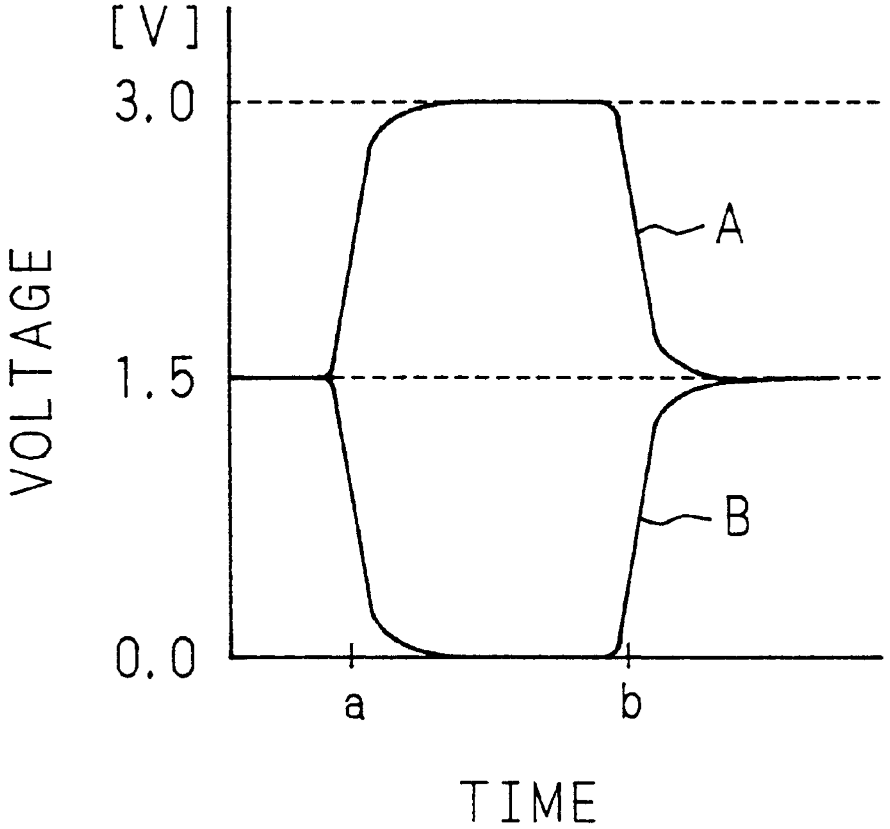
FIG. 4 is a diagram showing the output waveforms of first and second operation circuits.

The following description is applicable when the capabilities and switching timings of the two inverters are the same, the capacitance values of parasitic load capacitors 25 and 26 are the same, and the signal level transition directions of the two inverters are opposite to each other. In this case, the output waveforms of the inverters are as shown in FIG. 4. At time a when the voltage at the output node A rises (when the voltage at the output node B falls), the P-ch Tr 21 and the N-ch Tr 24 turn on. The load capacitor 25 is thus charged and the load capacitor 26 is discharged.

At time b when the voltage at the output node A falls (the voltage at output node B rises), the N-ch Tr 22 and the P-ch Tr 23 turn on. The load capacitor 25 is discharged and the load capacitor 26 is charged. Although charge redistribution occurs at this time, middle potential Vmid is held constant even when no electrical charge is supplied from the middle voltage power source 27, since the capacitors 25 and 26 have the same capacitance value. In other words, the electrical charges of the load capacitor 25 move through the connection node of the N-ch Tr 22 and the P-ch Tr 23. This means that the electrical charges have been reused to charge the load capacitor 26, In the N-ch Tr 22, to the source of which the middle voltage Vmid is applied, the potential at the substrate thereof is not set at the middle potential Vmid but set at the ground potential Gnd. This is because the driving capability of the transistor is changed, in case the potential at the substrate is set at the middle potential Vmid which may fluctuate. When the substrate is grounded, the driving capability is not only stabilized, but also increased. In addition, when the potential at the substrate is lowered, threshold voltage Vth is raised by a substrate effect, being effective in decreasing leak current. Furthermore, when the substrate is grounded, the MOS-IC 1 can be laid out easily. In other words, it is very difficult to form a well to set the potential of the substrate at the middle potential Vmid in the layout of the MOS-IC 1.

For the same reason, the potential of the substrate of the P-ch Tr 23, to the source of which the middle potential Vmid is applied, is not set at the middle potential Vmid but set at the source potential Vcc.

In case a part of electrical charges of the load capacitor 25 is not reused to charge the load capacitor 26 because of deviated switching timing at the two inverters, insufficient electrical charges are supplied from the middle voltage power source 27.

Although the first operation circuit and the second operation circuit are explained respectively by using a single inverter to simplify the explanation, the same explanation can be applied even when a larger scale circuit is used for the first operation circuit and the second operation circuit.

Figure 5:
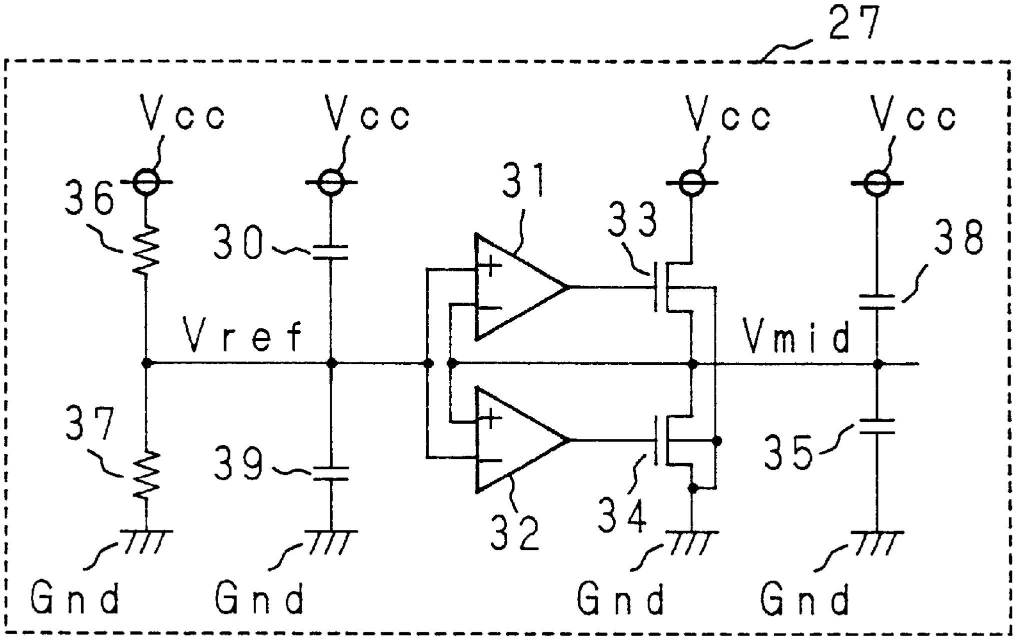
FIG. 5 is a circuit diagram showing a structure of a middle voltage power source.

FIG. 5 is a circuit diagram showing a structure example of the middle potential power source 27 of embodiment 1. The middle voltage power source 27 comprises two resistors 36 and 37 connected in series, two capacitors 30 and 39 connected in series, two N-ch Trs 33 and 34 connected in series, two capacitors 38 and 35 connected in series, these being connected in parallel between the power source Vcc and the ground Gnd, and further comprises operational-amplifiers (hereinafter referred to as "OP-amp")31 and 32. The connecting point of the resistors 36 and 37 is connected to the connecting point of the capacitors 30, 39 and to the non-inverting input terminal of the OP-amp 31 and the inverting input terminal of the OP-amp 32. Consequently, the source voltage is divided by the resistance ratio of the resistors 36 and 37, and the obtained potential is supplied to the OP-amps 31 and 32 as reference potential Vref.

The output terminal of the OP-amp 31 is connected to the gate of the N-ch Tr 33, and the output terminal of the OP-amplifier 32 is connected to the gate of the N-ch Tr 34. The substrates of the N-ch Trs 33 and 34 are grounded. The inverting input terminal of the OP-amp 31 is connected to the noninverting input terminal of the OP-amp 32. This connecting point is connected to the connecting point of the N-ch Trs 33 and 34 and the connecting point of the capacitors 38 and 35, and is used as a middle potential node. From this point, the middle potential Vmid is outputted, which is determined by the reference potential Vref.

When the middle potential Vmid drops lower than the reference potential Vref, the OP-amp 31 detects the drop, and the N-ch Tr 33 turns on. As the result electrical charges are supplied to the middle potential node. Conversely, when the middle potential Vmid rises higher than the reference potential Vref, the OP-amp 32 detects the rise, and the N-ch Tr 34 turns on. As the result electrical charges are removed from the middle potential node.

The capacitors 38 and 35 have a capacitance enough to stabilize the middle potential Vmid, and are almost the same in size. Since the capacitors 38 and 35 are connected to the middle potential node, the effect caused when the source potential Vcc or the ground potential Gnd fluctuates is reduced and the middle potential Vmid is stabilized. Therefore the node stabilization circuit includes at least the capacitors 38 and 35 and can the middle voltage power source 27.

Although the reference potential is obtained by a voltage divided by the resistance ratio of the resistors in the present embodiment, the reference potential can be supplied from outside of the MOS-IC. In this case, the reference potential can be adjusted easily, and the problem of an operation margin or the like can be solved. The capacitors 38 and 35 may be provided outside the middle voltage power source 27 and connected to the middle potential node.

Embodiment 2

Figure 6:
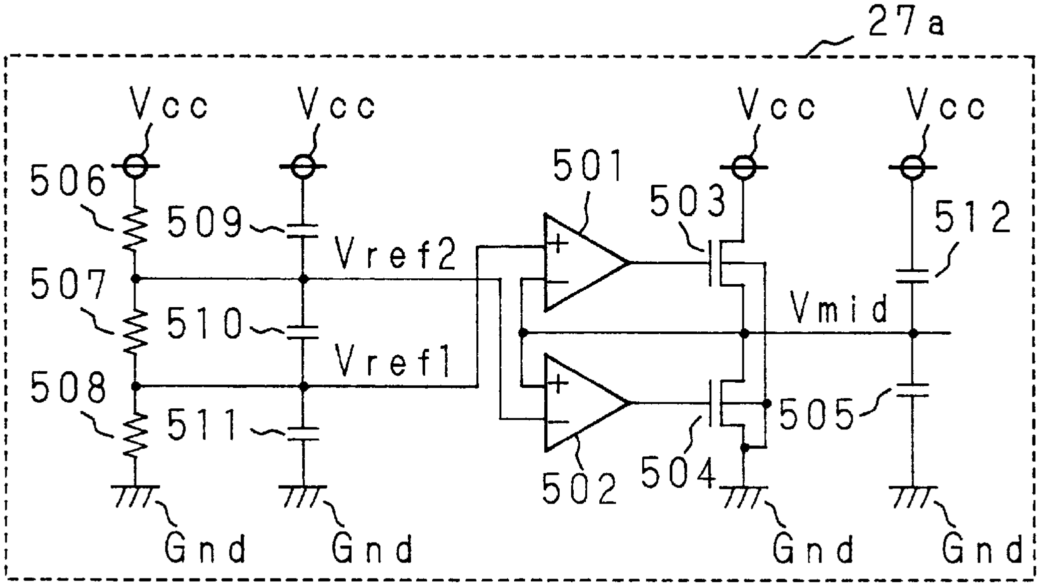
FIG. 6 is a circuit diagram showing another structure of a middle voltage power source.

FIG. 6 is a circuit diagram showing the structure of a middle voltage power source 27*a* of embodiment 2. The middle voltage power source 27*a* comprises three resistors 506, 507 and 508 connected in series, three capacitors 509, 510 and 511 connected in series, two N-ch Trs 503, 504 connected in series, two capacitors 512 and 505 connected in series, these being connected in parallel between the power source Vcc and the ground Gnd, and further comprises OP-amps 501 and 502. The connecting point of the resistors 506 and 507 is connected to the connecting point of the capacitors 509 and 510 and to the inverting input terminal of the OP-amp 502. The connecting point of the resistors 507 and 508 is connected to the connecting point of the capacitors 510, 511 and to the noninverting input terminal of the OP-amp 501.

The potential obtained by dividing the source voltage by the resistance ratio between the resistors 506 and 507 and the resistor 508 is applied from the connecting point of the resistors 507 and 508 to the noninverting input terminal of the OP-amp 501 as a first reference potential Vref1. The potential obtained by dividing the source voltage by the resistance ratio between the resistor 506 and the resistors 507 and 508 is applied from the connecting point of the resistors 506 and 507 to the inverting input terminal of the OP-amp 502 as a second reference potential Vief2.

The output terminal of the OP-amp 501 is connected to the gate of the N-ch Tr 503 and the output terminal of the OP-amp 502 is connected to the gate of the N-ch Tr 504. The substrates of the N-ch Trs 503 and 504 are grounded. The inverting input terminal of the OP-amp 501 is connected to the noninverting input terminal of the OP-amp 502. This connecting point is connected to the connecting point of the N-ch Trs 503 and 504 and the connecting point of the capacitors 512 and 505, and is used as a middle potential node. The middle potential Vmid determined by the first reference potential Vref1 and the second reference potential Vref2 is outputted from this connecting point. Since the structure of the MOS-IC of the embodiment 2 is similar to the structure of the embodiment 1 except the middle voltage power source 27*a*, any further description is omitted.

The first and second reference potentials Vref1 and Vref2 are determined by the ratios obtained by the values of the resistors 506, 507 and 508. The relationship between the first reference potential Vref1 and the second reference potential Vref2 is given by Vref2>Vref1. Then the middle potential Vmid drops lower than the first reference potential Vref1, the OP-amp 501 detects the drop and the N-ch Tr 503 turns on. By this operation, electrical charges are supplied to the middle potential node. Conversely, when the middle potential Vmid rises higher than the second reference potential Vref2, the OP-amp 502 detects the rise and the N-ch Tr 504 turns on. By this operation, electrical charges are removed from the middle potential node.

The middle voltage power source 27*a* (FIG. 6) differs from the middle voltage power source 27 (FIG. 5) in that the two OP-amps 501 and 502 do not operate in the range (dead band) between the first reference potential Vref1 and the second reference potential Vref2. In this range, the electrical charges of the capacitors 512 end 505 are used to stabilize the middle potential Vmid at the middle potential node. As the result, the middle voltage power source 27*a* is prevented from reacting too sensitively.

The capacitors 512 and 505 have capacitances enough to stabilize the middle potential Vmid, and are almost the same in size. Since the capacitors 512 and 505 are connected to the middle potential node, the influence caused when the source potential Vcc or the ground potential Gnd fluctuates is reduced and the middle potential Vmid is stabilized. In addition, the capacitors 509, 510 and 511 have capacitances enough to stabilize the first reference potential Vref1 and the second reference potential Vref2.

Although the first reference potential Vref1 and the second reference potential Vref2 are obtained by voltages divided by the resistance ratios of the resistors as described above, the first reference potential Vref1 and the second reference potential Vref2 can be supplied from outside of the MOS-IC. In this case, the allowable range of the middle potential Vmid can be changed as desired, and the problem of an operation margin or the like can be solved.

Figure 7:
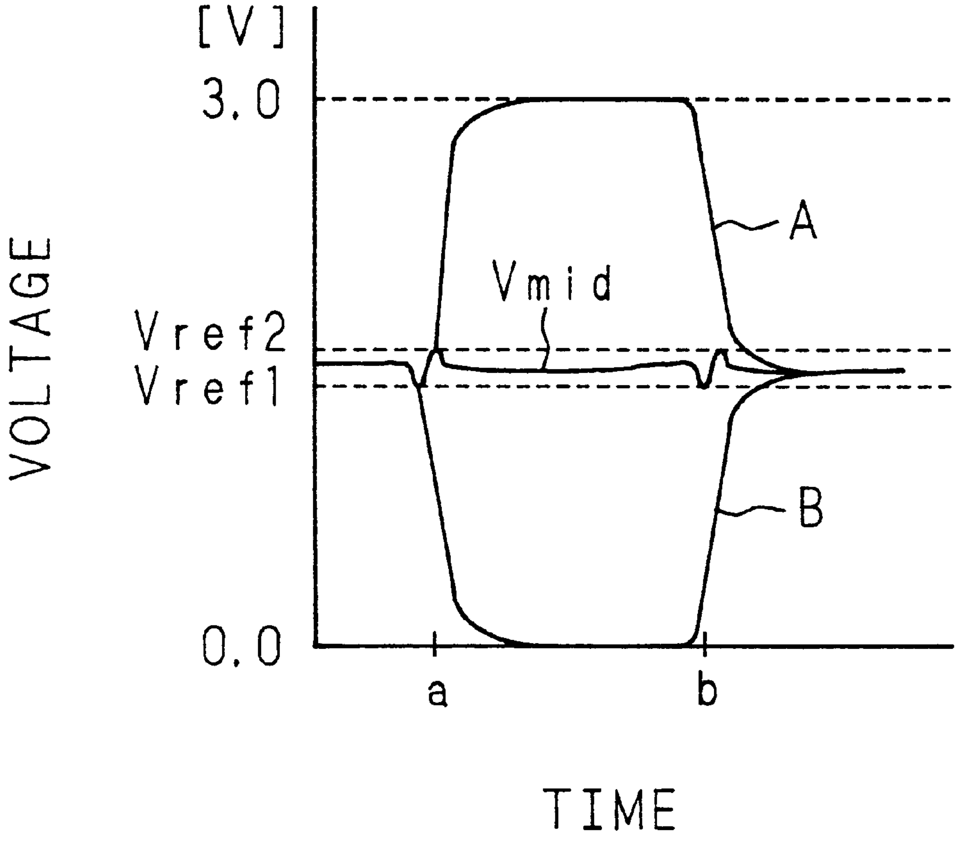
FIG. 7 is a diagram showing the output waveforms of the first and second operation circuits.

FIG. 7 shows the output waveform of the operation circuit shown in FIG. 3 of this embodiment. When the rising timing at the output node A is deviated from the falling timing at the output node B, the middle potential Vmid fluctuates a little but is in the range between the first reference potential Vref1 and the second reference potential Vref2. Accordingly, the operation circuit operates with electrical charges not supplied from the middle voltage power source 27*a*. Since the operation of the MOS-IC of the embodiment 2 is similar to the operation of the embodiment 1 except the operation described above, any further description is omitted.

Embodiment 3

Figure 8:
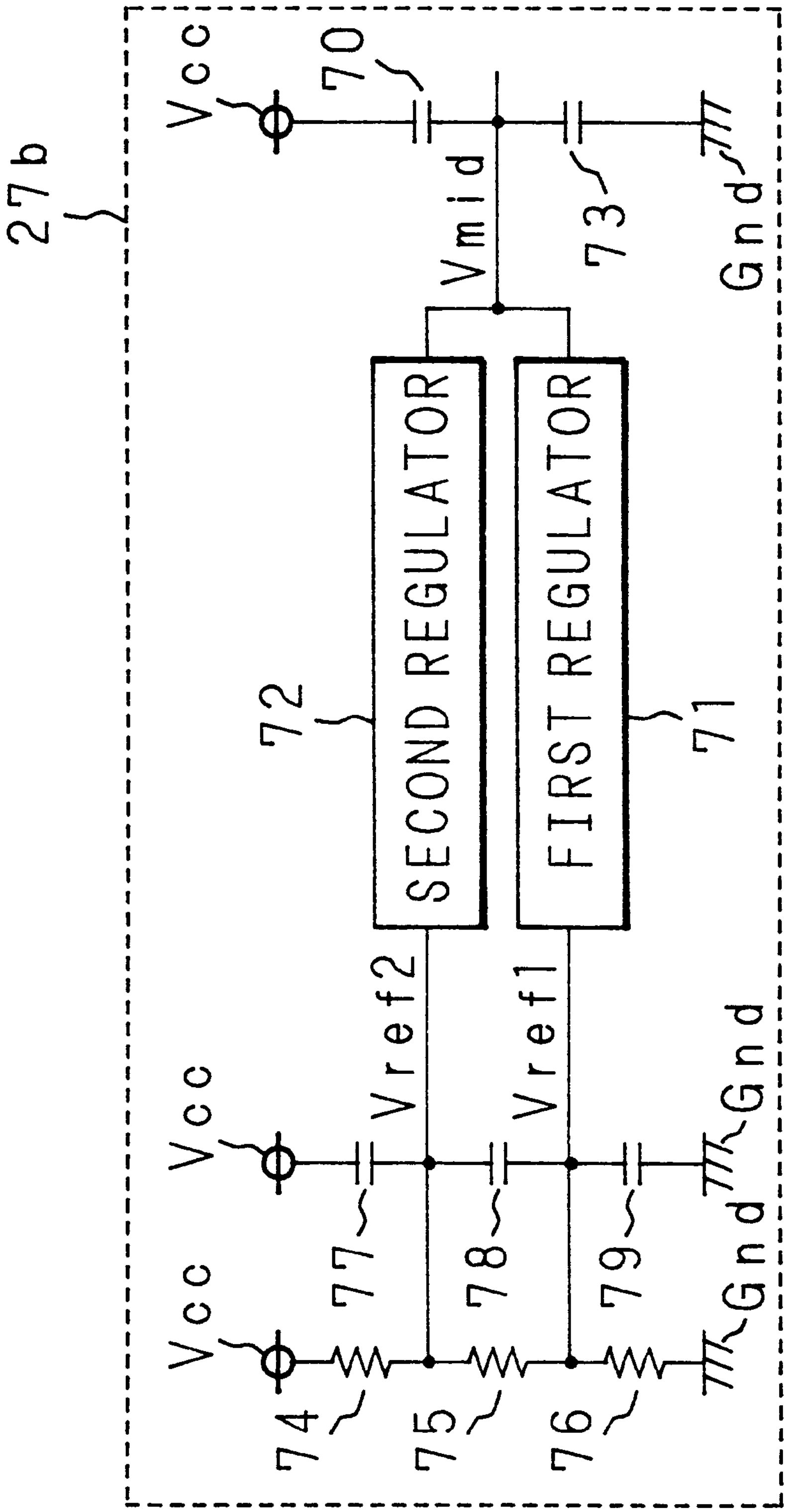
FIG. 8 is a circuit diagram showing still another structure of a middle voltage power source.

FIG. 8 is a circuit diagram showing the structure of a middle voltage power source 27*b* of embodiment 3. The middle voltage power source 27*b* is obtained by replacing the OP-amps 501 and 502 of the middle voltage power source 27*a* (FIG. 6) with regulators. The middle voltage power source 27*b* comprises three resistors 74, 75 and 76 connected in series, three capacitors 77, 78 and 79 connected in series, two capacitors 70 and 73 connected in series, these being connected in parallel between the power source Vcc and the ground Gnd, and further comprises a first regulator 71 and a second regulator 72. The connecting point of the resistors 74 and 75 is connected to the connecting point of the capacitors 77 and 78 and to the input terminal of the second regulator 72. In addition, the connecting point of the resistors 75 and 76 is connected to the connecting point of the capacitors 78 and 79 and to the input terminal of the first regulator 71.

The potential obtained by dividing the source voltage by the resistance ratio between the resistors 74 and 75 and the resistor 76 is applied from the connecting point of the resistors 75 and 76 to the first regulator 71 as a first reference potential Vref1. The potential obtained by dividing the source voltage by the resistances ratio between the resistor 74 and the resistors 75 and 76 is applied from the connecting point of the resistors 74 and 75 to the second regulator 72 as a second reference potential Vref2. The output terminal of the regulator 71 is connected to the output terminal of the second regulator 72. This connecting point is connected to the connecting point of the capacitors 70 and 73, and used as a middle potential node. A middle potential Vmid determined by the first reference potential Vref1 and the second reference potential Vref2 is outputted from this connecting point.

Figure 9:
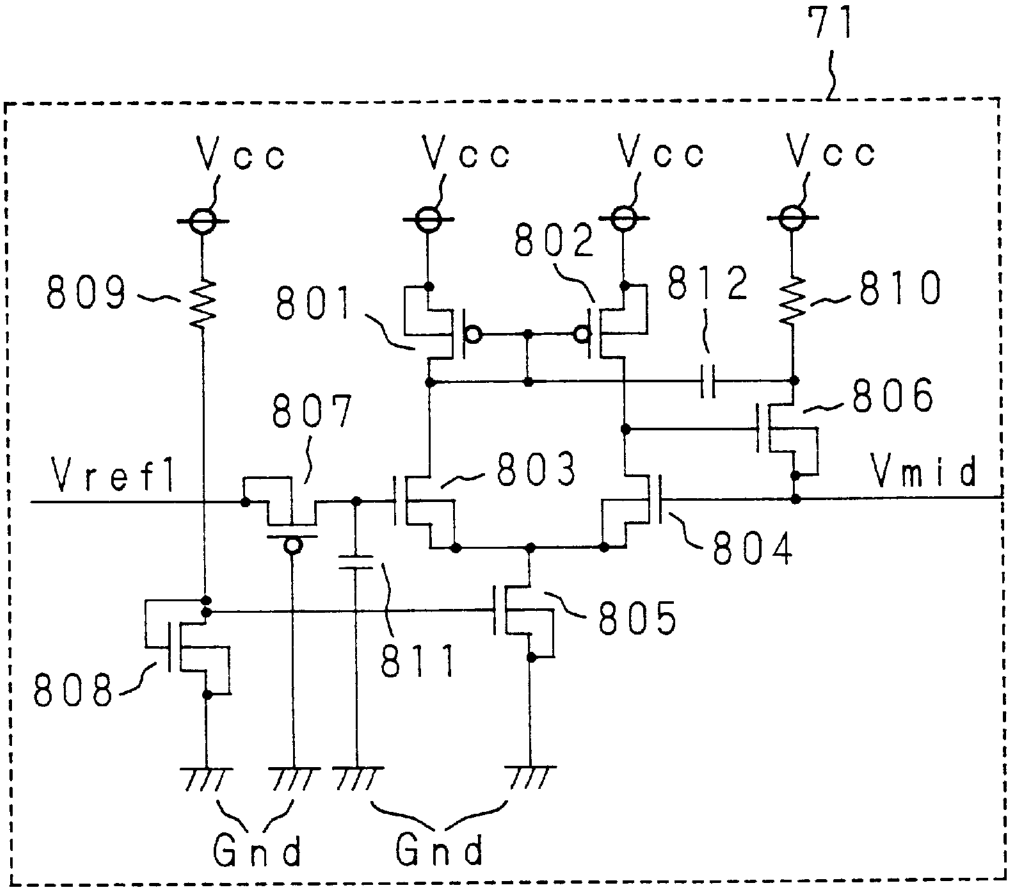
FIG. 9 is a circuit diagram showing the structure of a first regulator.

FIG. 9 is a circuit diagram showing the structure of the first regulator 71. The first regulator 71 uses a current mirror circuit. Two pairs of series-connected P-ch Tr and N-ch Tr are connected in parallel. The sources and substrates of the P-ch Trs 801 and 802 are connected to the power source Vcc. The sources of the N-ch Trs 803, 804 are grounded via an N-ch Tr 805 used as a constant current source. The connecting point of the P-ch Tr 801 and N-ch Tr 803 is connected to the gates of the P-ch Trs 801 and 802. The gate of the N-ch Tr 805 is connected to the power source Vcc via a resistor 809 and grounded via an N--ch Tr 808. The gate of the N-ch Tr 808 is connected to its drain and its substrate is grounded.

The first reference potential Vref1 is supplied to the source of a P-ch Tr 807, the back gate and source of which are connected to each other. The gate of the P-ch Tr 807 is grounded. The drain of the P-ch Tr 807 is connected to the gate of the N-ch Tr 803 and to a terminal of a capacitor 811, the other terminal of which is grounded.

The connecting point of the P-ch Tr 802 and N-ch Tr 804 is connected to the gate of an N-ch Tr 806. The source of the N-ch Tr 806 is connected to the power source Vcc via a resistor 810 and to the gates of the P-ch Trs 801 and 802 via a capacitor 812. The drain of the N-ch Tr 806 is connected to the back gate thereof and to the gate of the N-ch Tr 804, and is used as the middle potential node wherein the middle potential Vmid is generated.

The drain current of the N-ch Tr 803 is determined by the first reference potential Vref1. By this determination, the gate voltage of the P-ch Trs 801 and 802 is determined. The drain current of the P-ch Tr 802 is thus determined by the first reference potential Vref1. The drain current of the N-ch Tr 804 is determined by the middle potential Vmid. When the middle potential Vmid is higher than the first reference potential Vref1, the drain current of the P-ch Tr 802 is equal to the drain current of the N-ch Tr 804, and the gate voltage of the N-ch Tr 806 remains unchanged. The first regulator thus keeps a steady state. Conversely, when the middle potential Vmid is lower than the first reference potential Vref1, the drain current of the N-ch Tr 804 decreases. The gate voltage of the N-ch Tr 806 changes so that the drain current of the P-ch Tr 802 is equal to the drain current of the N-ch Tr 804. In accordance with the change, the middle potential Vmid rises.

Figure 10:
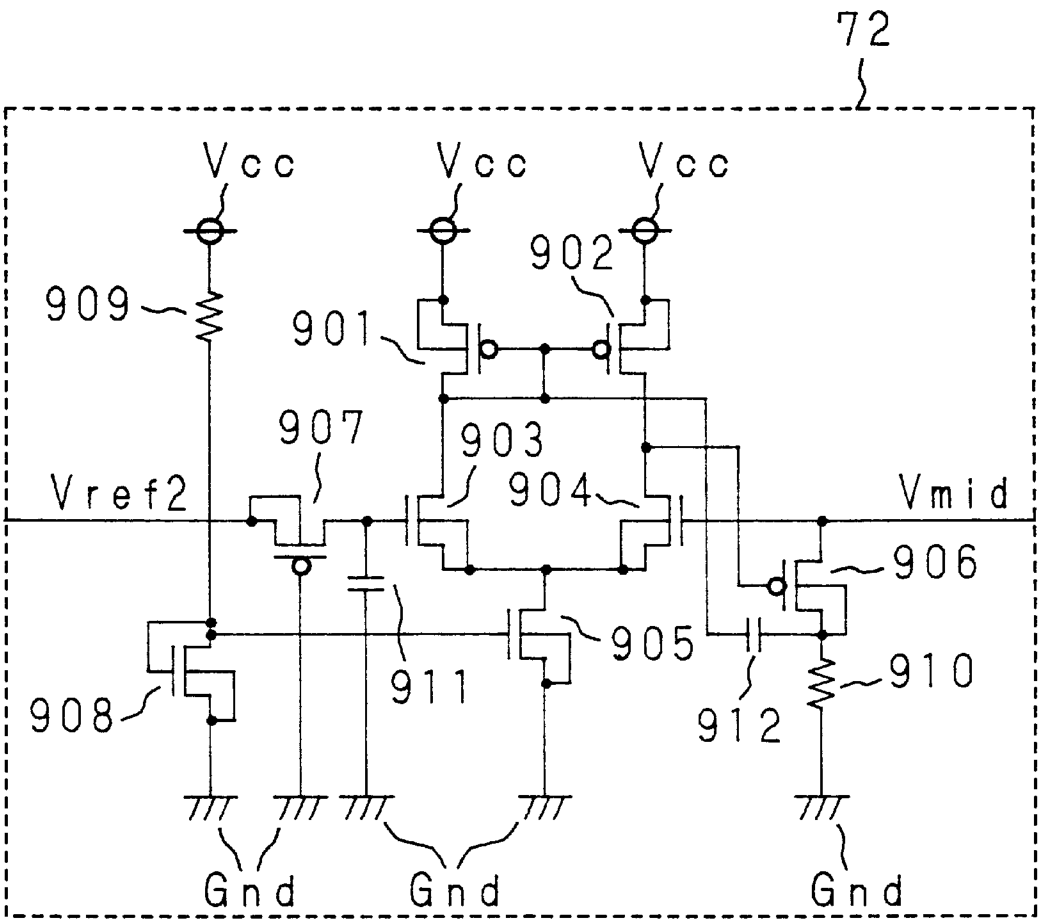
FIG. 10 is a circuit diagram showing the structure of a second regulator.

FIG. 10 is a circuit diagram showing the structure of the second regulator 72. The second regulator 72 uses a current mirror circuit. Two pairs of series-connected P-ch Tr and N-ch Tr are connected in parallel. The sources and substrates of P-ch Trs 901 and 902 are connected to the power source Vcc. The sources of N-ch Trs 903 and 904 are grounded via an N-ch Tr 905 used as a constant current source. The connecting point of the P-ch Tr 901 and N-ch Tr 903 is connected to the gates of the P-ch Trs 901 and 902. The gate of the N-ch Tr 905 is connected to the power source Vcc via a resistor 909 and grounded via an N-ch Tr 908. The gate of the N-ch Tr 908 is connected to its drain and its substrate is grounded.

The second reference potential Vref2 is supplied to the source of a P-ch Tr 907, the back gate and source of which are connected to each other. The gate of the P-ch Tr 907 is grounded. The drain of the P-ch Tr 907 is connected to the gate of the N-ch Tr 903 and to a terminal of a capacitor 911, the other terminal of which is grounded.

The connecting point of the P-ch Tr 902 and N-ch Tr 904 is connected to the gate of a P-ch Tr 906. The source and back gate of the P-ch Tr 906 are grounded via a resistor 910, and connected to the gates of the P-ch Trs 901 and 902 via a capacitor 912. The drain of the P-ch Tr 906 is connected to the gate of the N-ch Tr 904, and is used as the middle potential node, wherein the middle potential Vmid is generated.

The drain current of the N-ch Tr 903 is determined by the second reference potential Vref2. By this determination, the gate voltage of the P-ch Trs 901 and 902 is determined. The drain current of the P-ch Tr 902 is thus determined by the second reference potential Vref2. The drain current of the N-ch Tr 904 is determined by the middle potential Vmid. When the middle potential Vmid is lower than the second reference potential Vref2, the drain current of the P-ch Tr 902 is equal to the drain current of the N-ch Tr 904, and the gate voltage of the P-ch Tr 906 remains unchanged. The second regulator 72 thus keeps a steady state. Conversely, when the middle potential Vmid is higher than the second reference potential Vref2, the drain current of the N-ch Tr 904 decreases and the gate voltage of the P-ch Tr 906 changes so that the drain current of the P-ch Tr 902 is equal to the drain current of the N-ch Tr 904. In accordance with the change, the middle potential Vmid lowers.

Since the structure of the MOS-IC of the embodiment 3 is similar to the structure of the embodiment 1 except the structure described above, any further description is omitted.

When the middle potential Vmid is lower than the first reference potential Vref1, the first regulator 71 raises the middle potential Vmid (supplies electrical charges). When the middle potential Vmid is higher than the second reference potential Vref2, the first regulator 71 lowers the middle potential Vmid (removes electrical charges). Accordingly, the middle voltage power source **27*b* does not operate in the range (dead band)of the first reference potential Vref1 to the second reference potential Vref2. In this voltage range, the electrical charges of the capacitors 70 and 73 are used to stabilize the middle potential Vmid at the middle potential node. By this stabilization, the middle voltage power source 27*b*** is prevented from reacting too sensitively.

By adding the capacitors 70 and 73 to the middle potential node, the influence caused when the level of the source potential Vcc or the level of the ground Gnd is changed is lessened, and the middle potential Vmid is stabilized. The capacitors 70 and 73 have capacitances enough to stabilize the middle potential Vmid and are almost the same in size. Furthermore, capacitors 77, 78 and 79 have capacitances enough to stabilize the first reference potential Vref1 and the second reference potential Vref2.

Since the operation of the MOS-IC of the embodiment 3 is similar to the operation of the embodiment 1 except the operation described above, any further description is omitted.

Although the first reference potential Vref1 and the second reference potential Vref2 are obtained by voltages divided by the resistance ratios of the resistors, the first reference potential Vref1 and the second reference potential Vref2 may be supplied from the outside of the MOS-IC 1. In this case, the allowable range of the middle potential Vmid can be changed as desired, and the problem of operation margin or the like can be solved.

Embodiment 4

Figure 11:
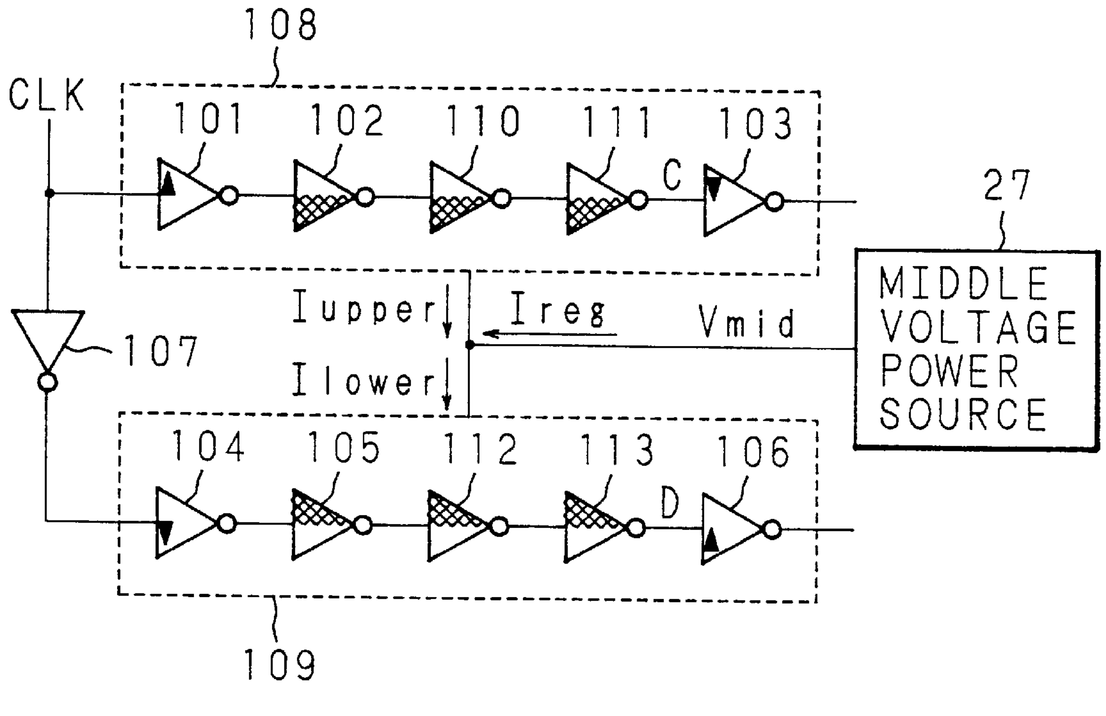
FIG. 11 is a circuit diagram showing the structure of an embodiment, wherein the MOS-IC of the invention is applied to clock buffer circuits.

FIG. 11 is a circuit diagram showing the structure of the MOS-IC of embodiment 4 which is applied to a clock buffer circuit. This MOS-IC comprises a first clock driver circuit (first operation circuit) 108 to which the clock signal from a clock generator is directly supplied, and a second clock driver circuit (second operation circuit) 109 to which the clock signal is supplied via an inverter 107.

The first clock driver circuit 108 comprises a level conversion circuit 101 for converting a signal (clock) fully swinging between the source potential Vcc and the ground potential Gnd into a signal swinging at the upper level between the source potential Vcc and the middle potential Vmid (Vcc/2 for example), inverters (clock buffer circuits) 102, 110 and 111 operating at the upper level, and a level conversion circuit 103 for converting a signal swinging at the upper level into a signal (clock) fully swinging between the source potential Vcc and the ground potential Gnd, and for outputting the signal, these being connected in series.

The second clock driver circuit 109 comprises a level conversion circuit 104 for converting a signal fully swinging between the source potential Vcc and the ground potential Gnd into a signal swinging at the lower level between the middle potential Vmid and the ground potential Gnd, inverters (clock buffer circuits) 105, 112 and 113 operating at the lower level, and a level conversion circuit 106 for converting a signal swinging at the lower level into a signal (clock) fully swinging between the source potential Vcc and the ground potential Gnd, and for outputting the signal, these being connected in series.

In this embodiment, pairs of inverters (102 and 105; 110 and 112; 111 and 113) have the same driving capability, and also have the same parasitic capacitance.

The first clock driver circuit 108 and the second clock driver circuit 109 are respectively connected to the middle potential node so that the middle potential Vmid can be supplied from the middle voltage power source 27 to the respective internal circuits thereof.

Figure 12:
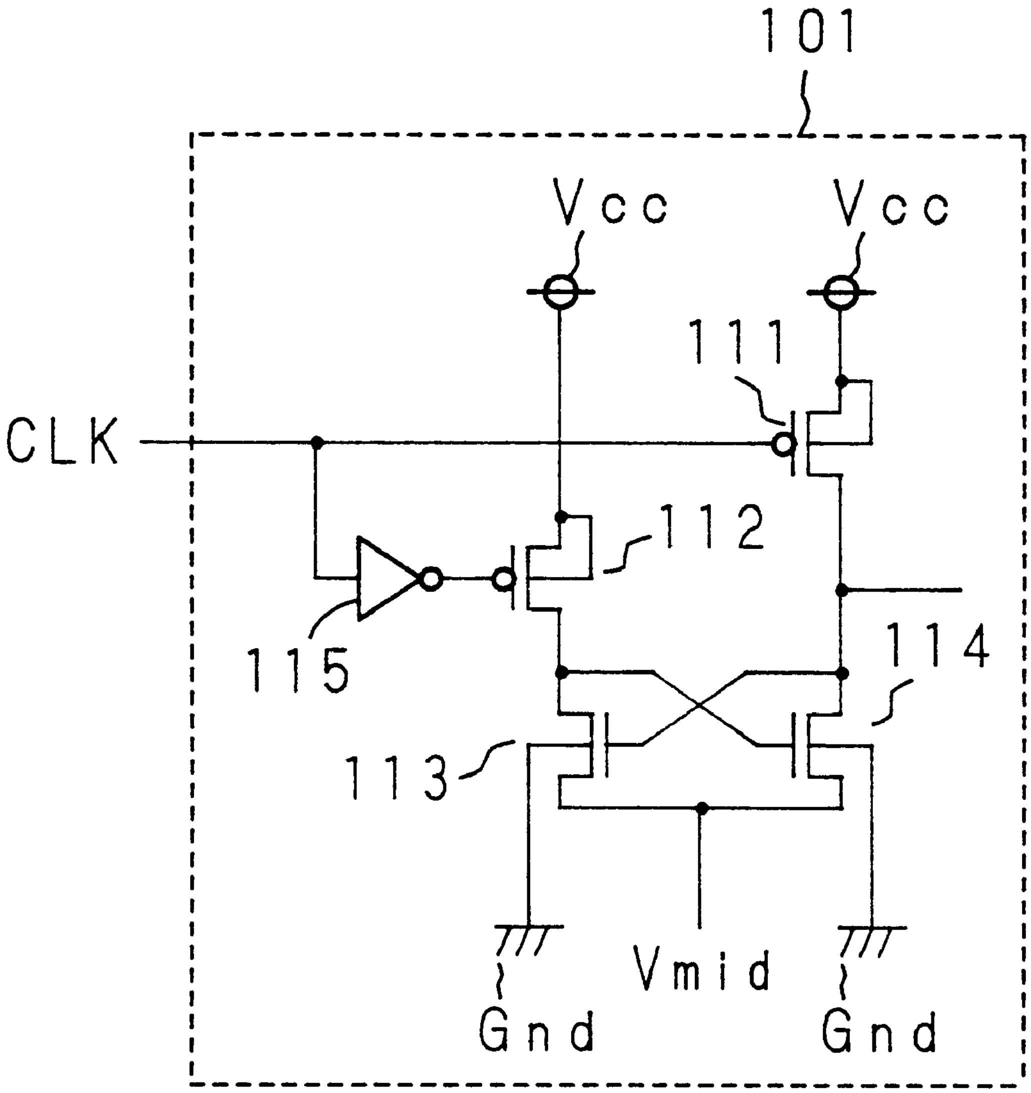
FIG. 12 is a circuit diagram showing the structure of a level conversion circuit.

FIG. 12 is a circuit diagram showing the structure of the level conversion circuit 101. Two pairs of series-connected P-ch and N-ch Trs are connected in parallel. The sources and substrates of P-ch Trs 112 and 111 are connected to the source potential Vcc. The middle potential node is connected to the sources of N-ch Trs 113 and 114, and the substrates of the Trs are grounded. Clock CLK from the clock generator is directly supplied to the gate of the P-ch Tr 111 and further supplied to the gate of the P-ch Tr 112 via an inverter 115.

The gate of the N-ch Tr 113 is connected to the drain of the N-ch Tr 114, and the gate of the N-ch Tr 114 is connected to the drain of the N-ch Tr 113. A signal swinging at the upper level is outputted from the connecting point (output node) of the drain of the N-ch Tr 114 and the drain of the P-ch Tr 111.

Since the cross coupling section of the circuit comprises the N-ch Trs 113 and 114 as shown in FIG. 12, the voltage at the output node can swing at the upper level between the source potential Vcc and the mid potential Vmid.

When clock CLK from the clock generator is at the level of the source potential Vcc, the P-ch Tr 112 and the N-ch 114 turn on, and the level conversion circuit 101 outputs a signal having the level of the middle potential Vmid. When clock CLK is at the level of the ground potential, the P-ch Tr 111 and the N-ch 113 turn on, and the level conversion circuit 101 outputs a clock signal having the level of the source potential Vcc.

Figure 13:
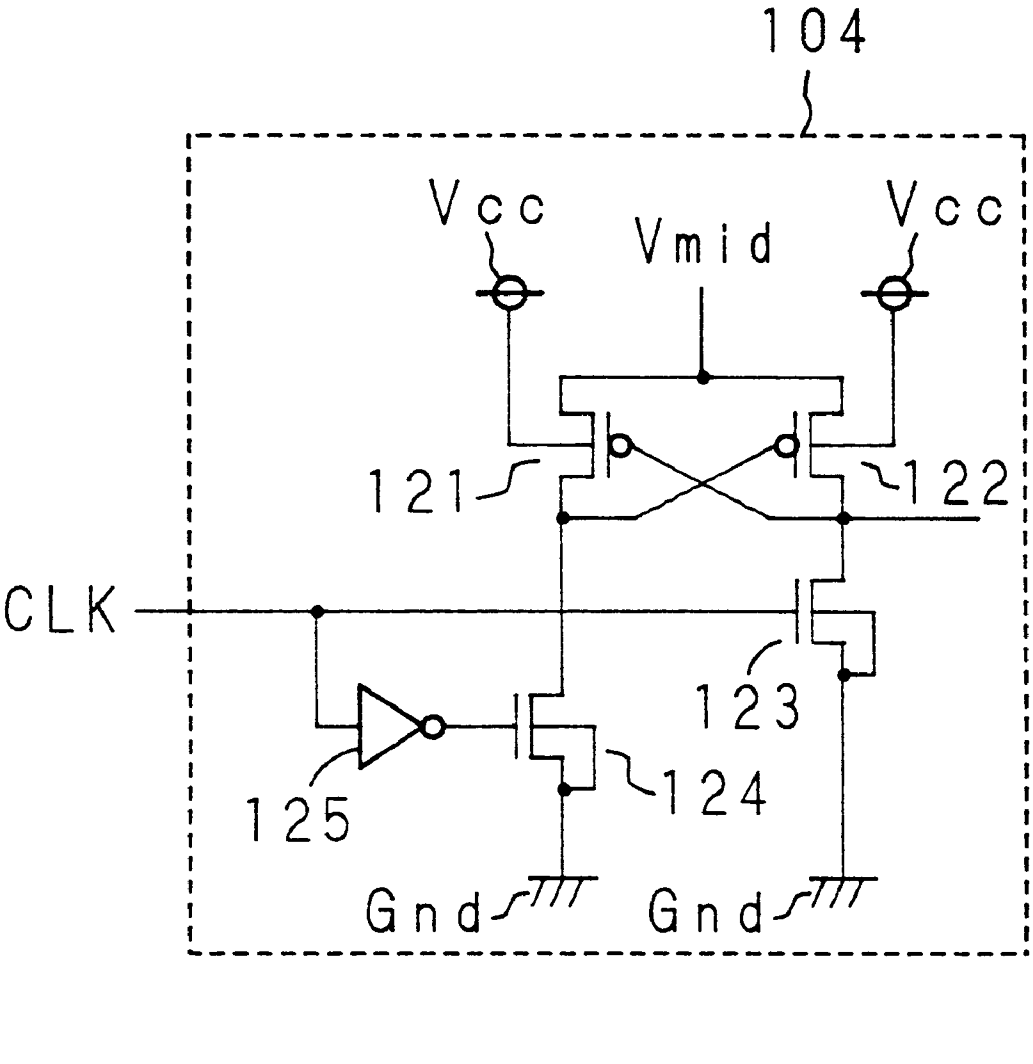
FIG. 13 is a circuit diagram showing the structure of a level conversion circuit.

FIG. 13 is a circuit diagram showing the structure of the level conversion circuit 104. Two pairs of series-connected P-ch and N-ch Trs are connected in parallel. The sources of P-ch Trs 121 and 122 are connected to the middle potential node and the substrates thereof are connected to the power source Vcc. The sources and substrates of N-ch Trs 124 and 123 are grounded. Clock CLK from a clock generator is directly supplied to the gate of the N-ch Tr 123 and further supplied to the gate of the N-ch Tr 124 via an inverter 125.

The gate of the P-ch Tr 122 is connected to the drain of the P-ch Tr 121, and the gate of the P-ch Tr 121 is connected to the drain of the P-ch Tr 122. A signal swinging at the lower level is outputted from the connecting point (output node) of the drain of the P-ch Tr 122 and the drain of the N-ch Tr 123.

Since the cross coupling section of the circuit comprises the P-ch Trs 121 and 122 as shown in FIG. 13, the voltage at the output node can swing at the lower level between the middle potential Vmid and the ground potential Gnd.

When clock CLK is at the level of the source potential Vcc, the N-ch Tr 123 and the P-ch 121 turn on, and the level conversion circuit 104 outputs a signal having the level of the ground potential Gnd. When clock CLK is at the level of the ground potential Gnd, the N-ch Tr 124 and the P-ch Tr 122 turn on, and the level conversion circuit 104 outputs a clock signal having the level of the middle potential Vmid.

Figure 14:
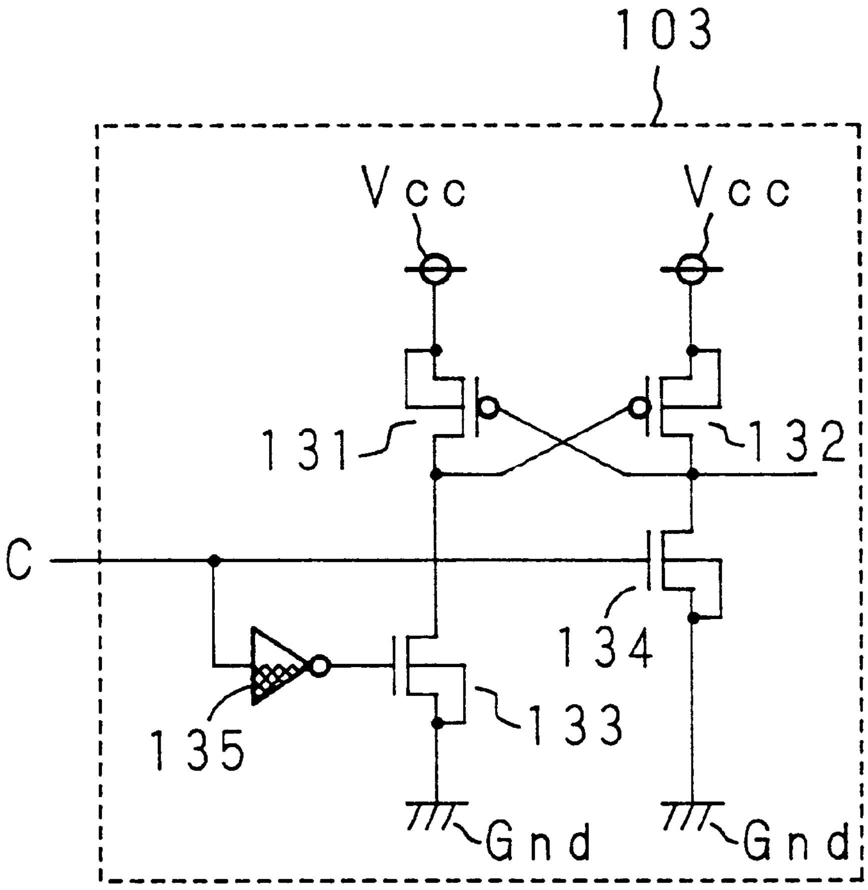
FIG. 14 is a circuit diagram showing the structure of a level conversion circuit.

FIG. 14 is a circuit diagram showing the structure of the level conversion circuit 103. Two pairs of series-connected P-ch and N-ch Trs are connected in parallel. The sources and substrates of P-ch Trs 131 and 132 are connected to the power source Vcc. The sources and substrates of N-ch Trs 133 and 134 are grounded. Clock C from the inverter 111 is directly supplied to the gate of the N-ch Tr 134 and further supplied to the gate of the N-ch Tr 133 via an inverter 135.

The gate of the P-ch Tr 132 is connected to the drain of the P-ch Tr 131, and the gate of the P-ch Tr 131 is connected to the drain of the P-ch Tr 132. A clock signal fully swinging between the source potential Vcc and the ground potential Gnd is outputted from the connecting point (output node) of the drain of the P-ch Tr 132 and the drain of the N-ch Tr 134.

When converting a signal swinging at the upper level into a full-swing signal, since the voltage at the input node swings only between the source potential Vcc and the middle potential Vmid, difference comparison cannot be performed sufficiently, unless the gates of the N-ch Trs 133 and 134 are used as the input node as shown in FIG. 14.

When clock C from the inverter 111 is at the level of the source potential Vcc, the N-ch Tr 134 and the P-ch Tr 131 turn on, and the level conversion circuit 103 outputs a signal having the level of the ground potential Gnd. When clock C from the inverter 111 is at the level of the middle potential Vmid, the N-ch Tr 133 and the P-ch Tr 132 turn on, and the level conversion circuit 103 outputs a clock signal having the level of the source potential Vcc.

Figure 15:
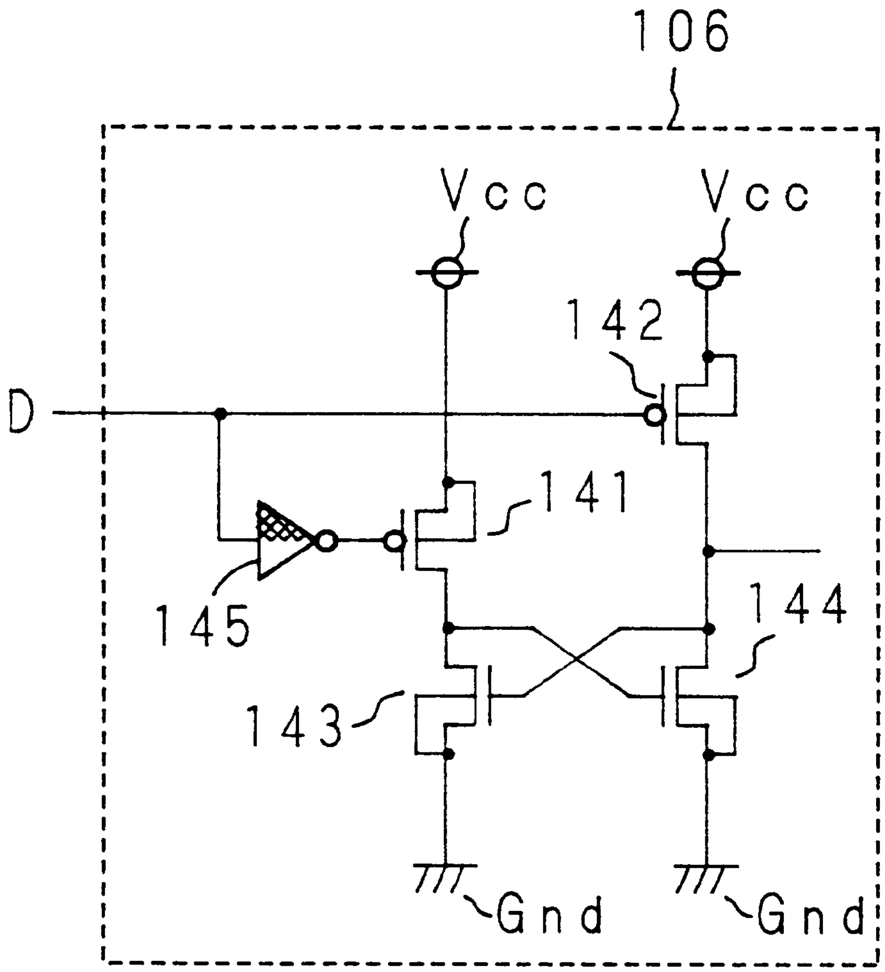
FIG. 15 is a circuit diagram showing the structure of a level conversion circuit.

FIG. 15 is a circuit diagram showing the structure of the level conversion circuit 106. Two pairs of series-connected P-ch and N-ch Trs are connected in parallel. The sources and substrates of the P-ch Trs 141 and 142 are connected to the power source Vcc. The sources and substrates of N-ch Trs 143 and 144 are grounded. Clock D from the inverter 113 is directly supplied to the gate of the P-ch Tr 142 and further supplied to the gate of the P-ch Tr 141 via an inverter 145.

The gate of the N-ch Tr 144 is connected to the drain of the N-ch Tr 143, and the gate of the N-ch Tr 143 is connected to the drain of the N-ch Tr 144. A clock signal fully swinging between the source potential Vcc and the ground potential Gnd is outputted from the connecting point (output node) of the drain of the N-ch Tr 144 and the drain of the P-ch Tr 142.

When converting a signal swinging at the lower level into a full-swing signal, since the voltage at the input node swings only between the middle potential Vmid and the ground potential Gnd, difference comparison cannot be performed sufficiently, unless the gates of the P-ch Trs 141 and 142 are used as the input node as shown in FIG. 15.

When clock D from the inverter 113 is at the level of the middle potential Vmid, the P-ch Tr 141 and the N-ch Tr 144 turn on, and the level conversion circuit 106 outputs a signal having the level of the ground potential Gnd. When clock D from the inverter 113 is at the level of the ground potential Gnd, the P-ch Tr 142 and the N-ch Tr 143 turn on, and the level conversion circuit 106 outputs a clock signal having the level of the source potential Vcc.

Figure 16:
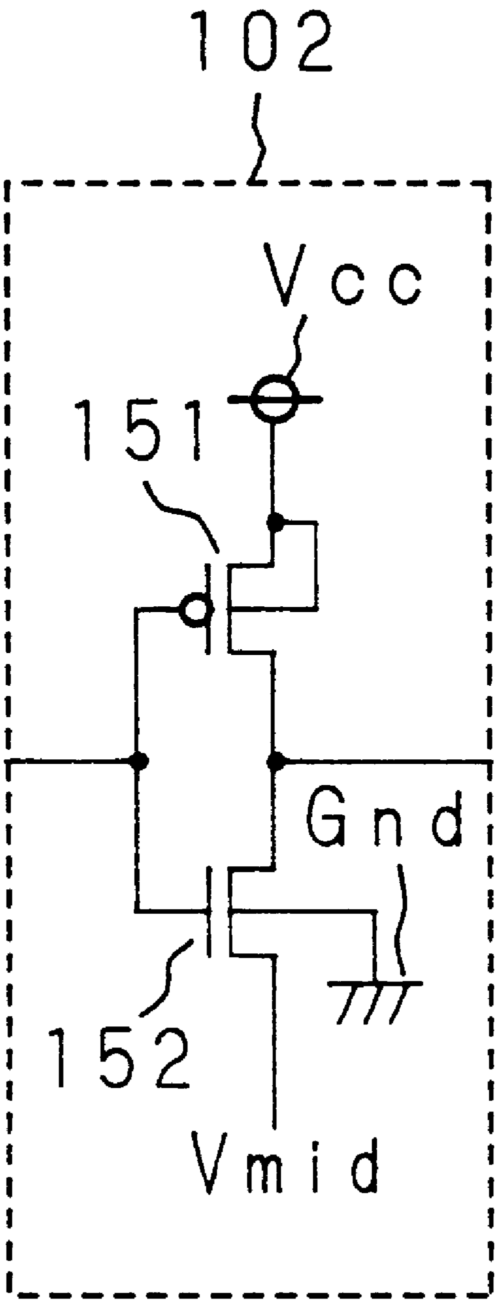
FIG. 16 is a circuit diagram showing the structure of an inverter.

FIG. 16 is a circuit diagram showing the structure of the inverters 102, 110 or 111. In the inverter 102 (110, 111), the drain of a P-ch Tr 151 is connected to the drain of an N-ch Tr 152. The source and substrate of the P-ch Tr 151 are connected to the power source Vcc. The source of the N-ch Tr 152 is connected to the middle potential node and the substrate of the N-ch Tr 152 is grounded. The connecting point of the gates of the P-ch Tr 151 and the N-ch Tr 152 is used as the input node, and the connecting point of their drains is used as the output node.

When the clock signal supplied is at the level of the source potential Vcc, the N-ch Tr 152 turns on, and the inverter 102 outputs a signal having the level of the middle potential Vmid. When the clock signal supplied is at the level of the middle potential Vmid, the P-ch Tr 151 turns on, and the inverter 102 outputs a signal having the level of the source potential Vcc.

Figure 17:
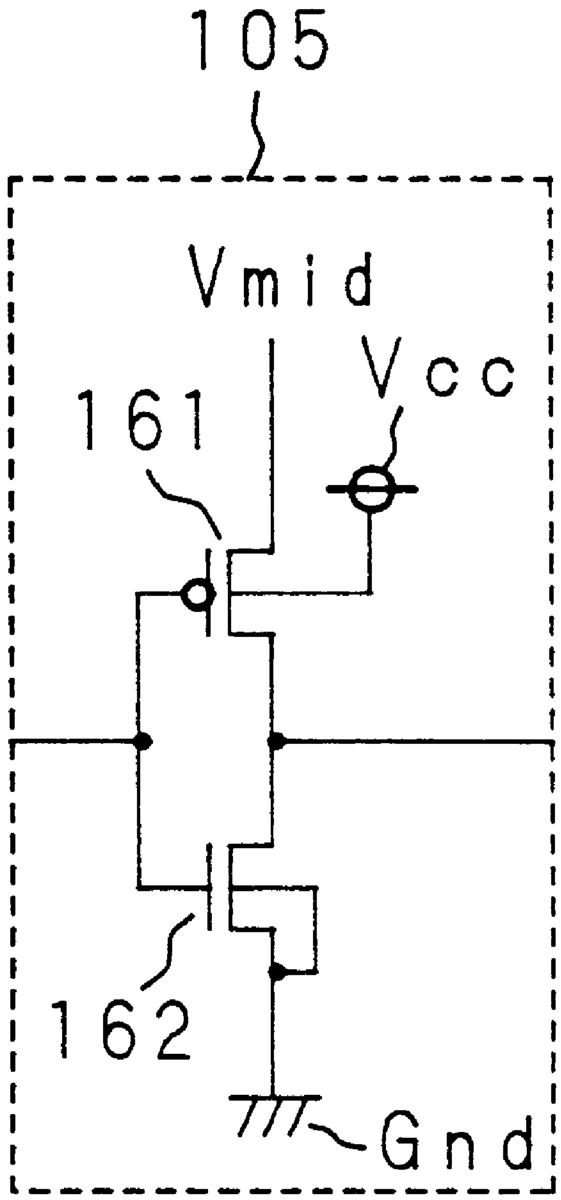
FIG. 17 is a circuit diagram showing the structure of an inverter.

FIG. 17 is a circuit diagram showing the structure of the inverters 105, 112 or 113. In the inverter 105 (112, 113), the drain of a P-ch Tr 161 is connected to the drain of an N-ch Tr 162. The source of the P-ch Tr 161 is connected to the middle potential node, and the substrate of the P-ch Tr 161 is connected to the power source Vcc. The source and substrate of the N-ch Tr 162 are grounded. The connecting point of the gates of the P-ch Tr 161 and the N-ch Tr 162 is used as the input node, and the connecting point of their drains is used as the output node.

When the clock signal supplied is at the level of the middle potential Vmid, the N-ch Tr 162 turns on, and the inverter 105 outputs a signal having the level of the ground potential Gnd. When the clock signal supplied is at the level of the ground potential Gnd, the P-ch Tr 161 turns on, and the inverter 105 outputs a signal having the level of the middle potential Vmid.

Since the structure of the MOS-IC of the embodiment 4 is similar to the structure of the embodiment 1 except the structure described above, any further description is omitted.

Figure 18:
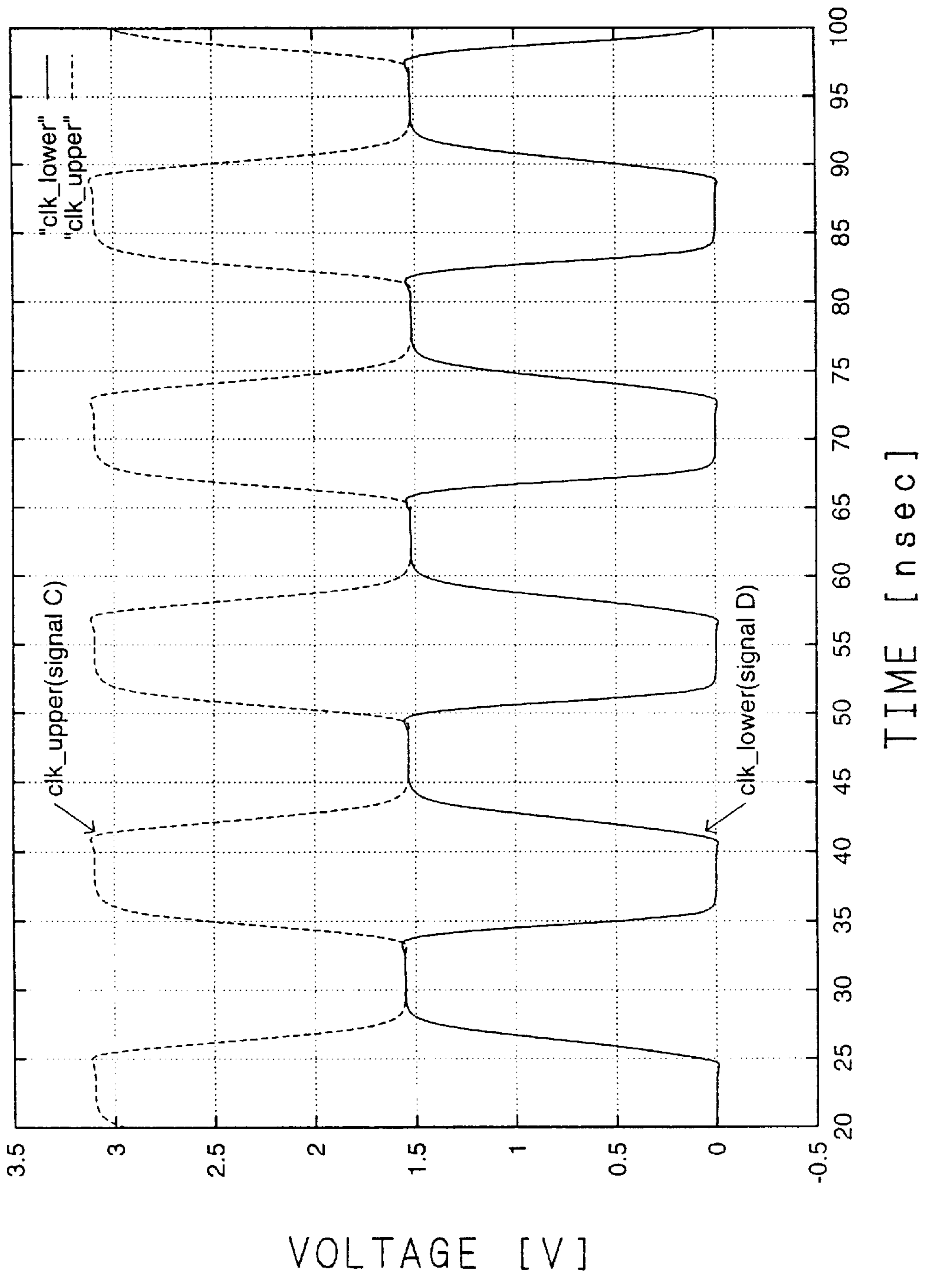
FIG. 18 is a diagram showing the waveforms of the clock signal at the upper and lower levels of the circuit shown in FIG. 11.

FIG. 18 is a waveform diagram showing the voltage values of the clock C (clk-upper) and the clock D (clk-lower). The nodes corresponding to the clock driver circuit 108 operating at the upper level and the clock driver circuit 109 operating at the lower level are constructed so as to operate in accordance with inverted waveforms having the same switching timing.

Figure 19:
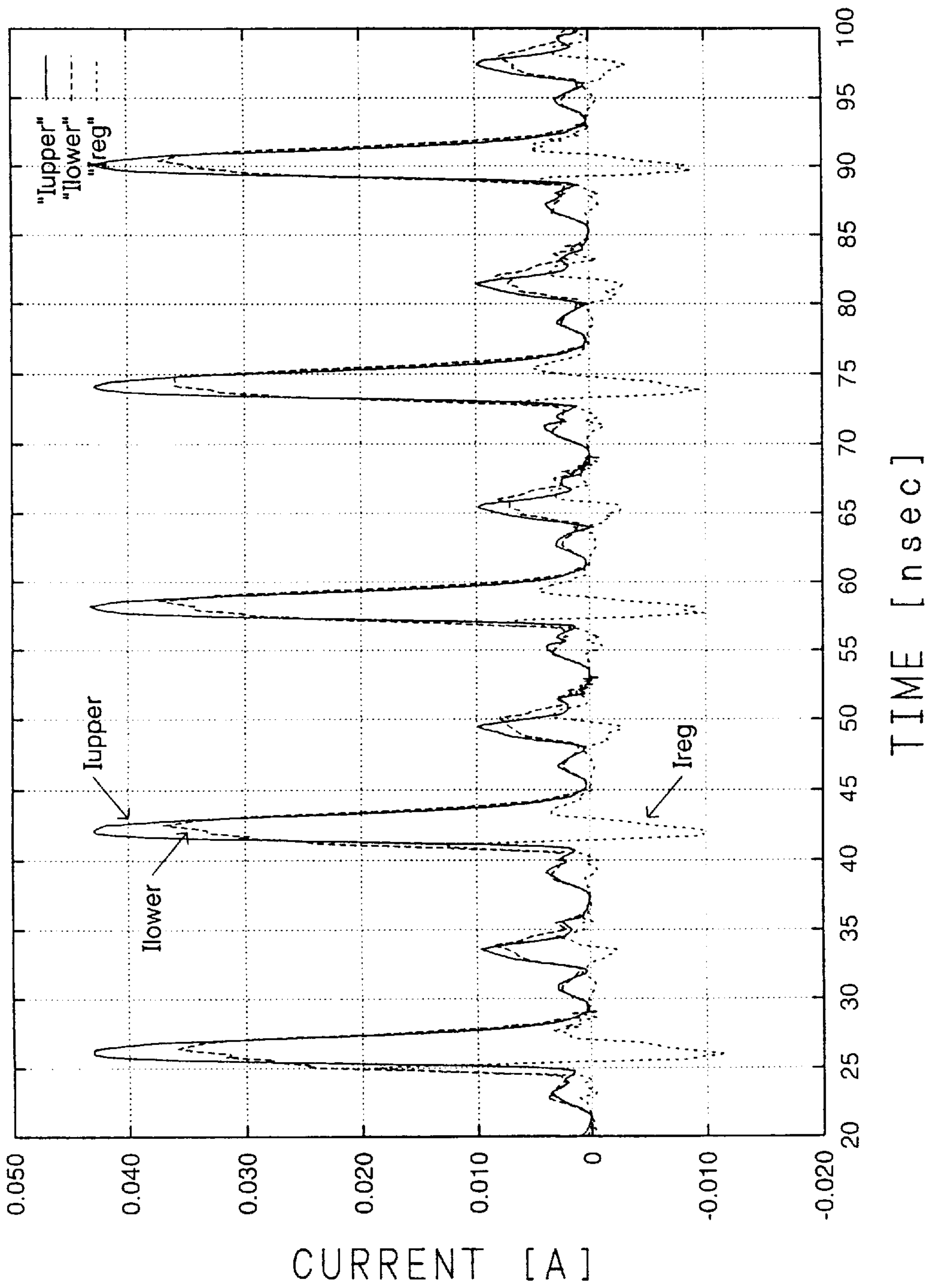
FIG. 19 is a waveform diagram showing the power consumption at the upper level and the lower level of the circuits shown in FIG. 11.

FIG. 19 is a waveform diagram showing current Iupper consumed by the clock driver circuit 108, current Ilower required by the clock driver circuit 109 and current Ireg supplied by the middle voltage power source 27. The time in FIG. 19 coincides with the time in FIG. 18.

According to FIGS. 18 and 19, it is found that current flows when the clock driver circuit is switching. Since this switching timing is almost the same over the entire clock driver circuit, the circuit operates without requiring much supply of current from the middle voltage power source 27.

Figure 20:
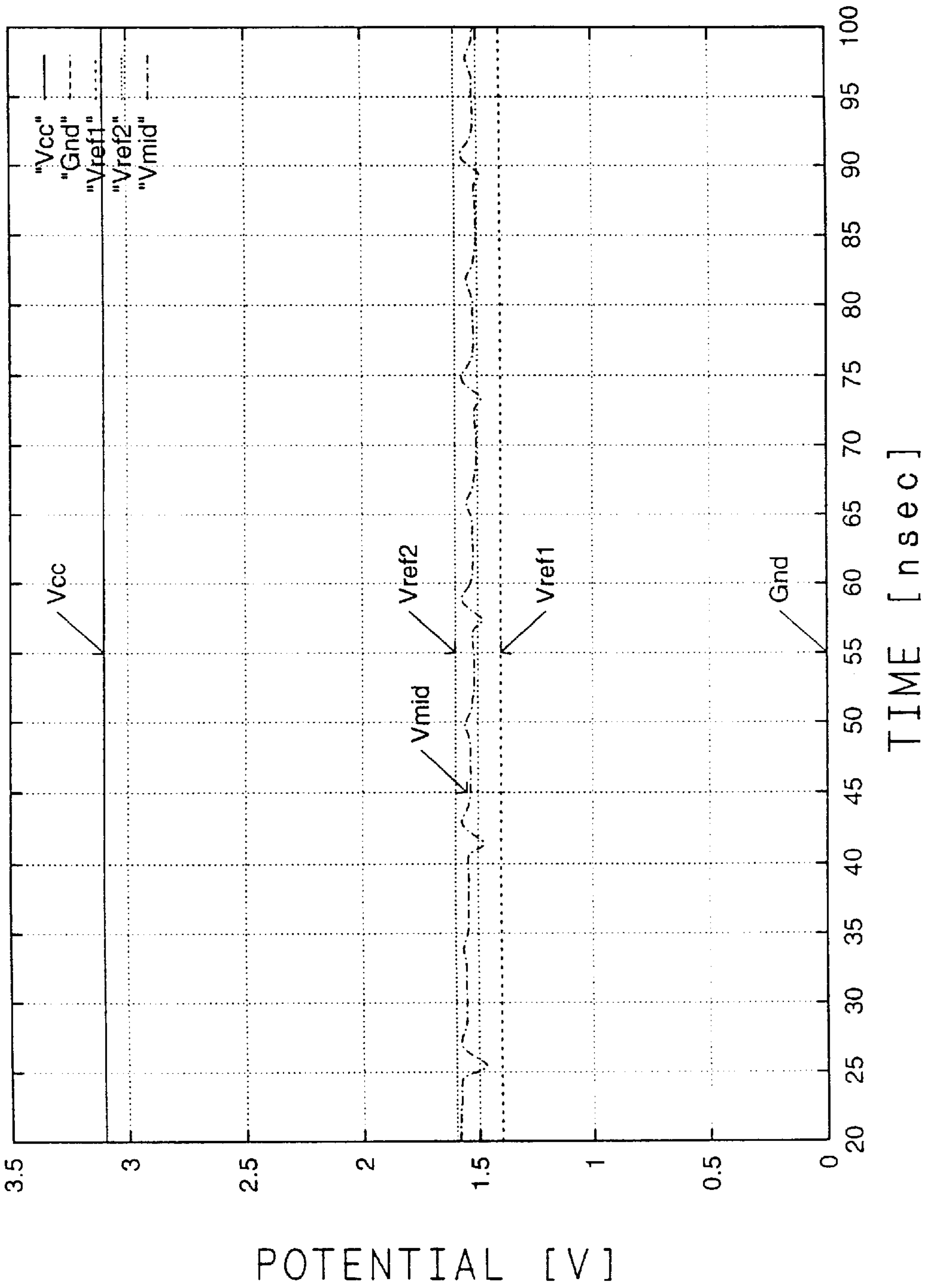
FIG. 20 is a waveform diagram showing the middle potential at the middle potential node.

FIG. 20 is a diagram showing the waveforms of the middle potential Vmid, the first reference potential Vref1 and the second reference potential Vref2 of the MOS-IC shown in FIG. 11. The time in FIG. 20 coincides with the time in FIGS. 18, 19. It is found that the middle potential Vmid fluctuates when the clock driver circuit is switching. According to FIG. 19, it is also found that current is supplied from the middle voltage power source 27 when the middle potential Vmid fluctuates significantly. The majority of the current from the middle voltage power source 27 is supplied from the capacitors (512 and 505 in FIG. 6, or 70 and 73 in FIG. 8). Accordingly, when the middle voltage power source 27*a* shown in FIG. 6 is used, the N-ch Trs 503 and 504 turn on, and little current is supplied from the power source Vcc or the ground Gnd.

Since the operation of the MOS-IC of the embodiment 4 is similar to the operation of the embodiment 1 except the operation described above, any further description is omitted.

Embodiment 5

Figure 21:
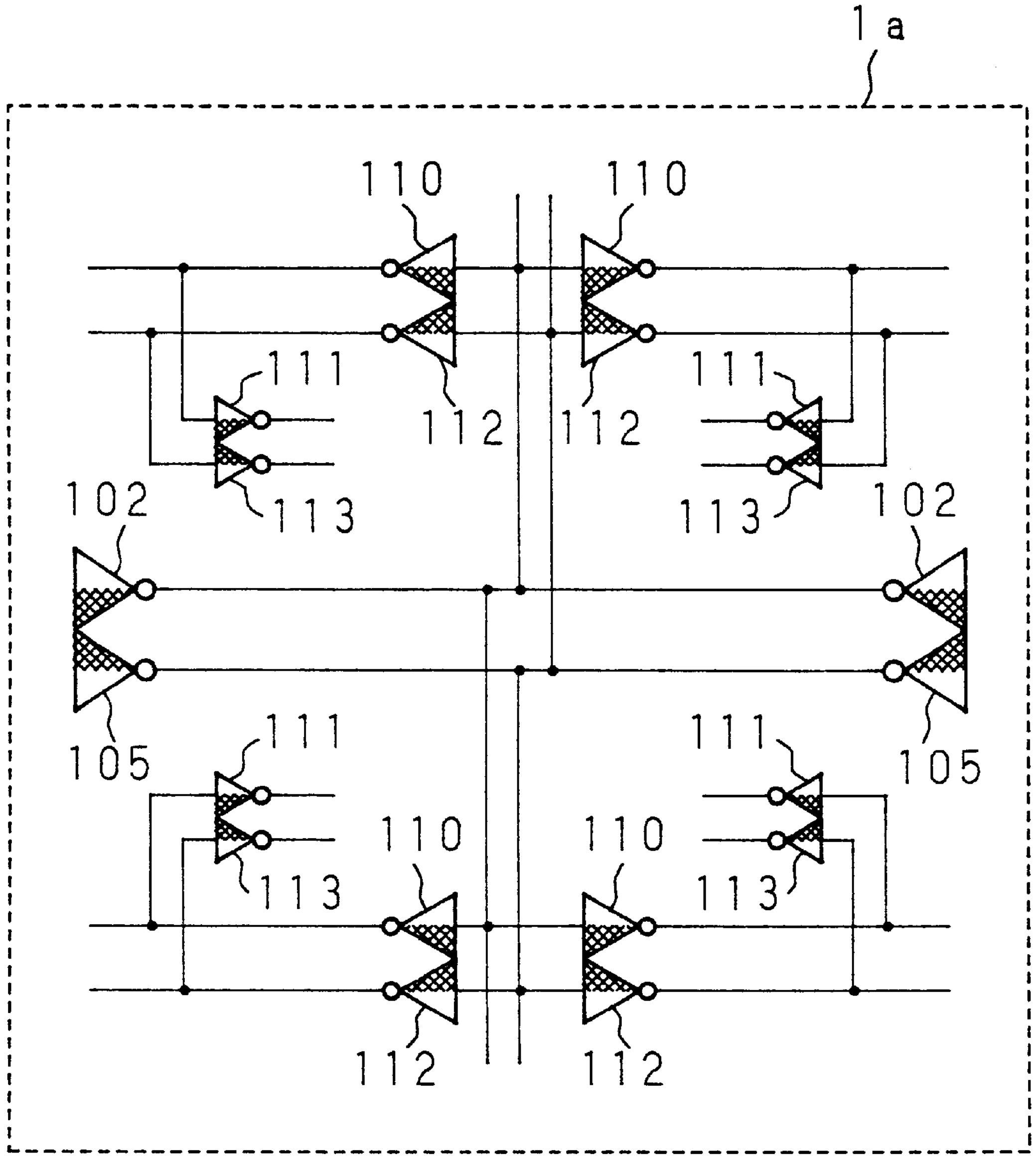
FIG. 21 is a circuit diagram showing the structure and layout of a MOS-IC of embodiment 5.

FIG. 21 is a circuit diagram showing the structure and an example of the layout of the MOS-IC according to embodiment 5, wherein the layout of the MOS-IC of the embodiment 4 is improved so that the clock signal can be distributed actually. The inverters 102, 105, 110, 111, 112 and 113 shown in FIG. 21 correspond to those shown in FIG. 11.

Pairs of inverters (102 and 105, 110 and 112, 111 and 113) have the same driving capability. In FIG. 21, corresponding inverters are laid out adjacent to each other. By this layout, parasitic load capacitances attendant on the wires of corresponding inverters can be made equal to each other. In addition, corresponding inverters operate at the same timing. By placing circuits operating at the same timing nearby, it is possible to avoid the delay due to wire resistance during the time of electrical charge supply at the middle potential node.

Since the structure and operation of the MOS-IC of the embodiment 5 is similar to those of the embodiment 4 except those described above, any further description is omitted.

Embodiment 6

Figure 22:
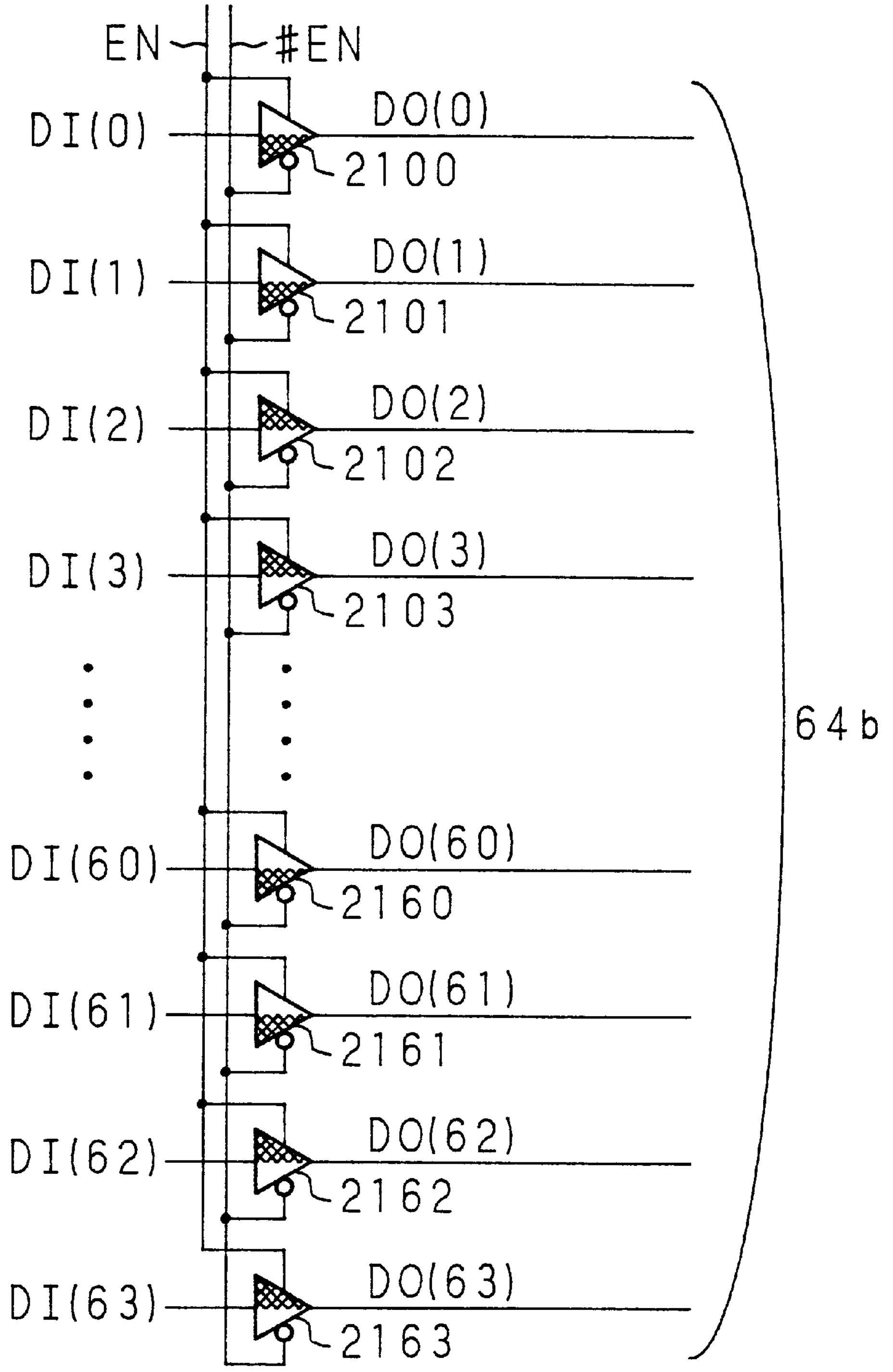
FIG. 22 is a circuit diagram showing the structure of an embodiment, wherein the MOS-IC of the invention is applied to a bus driver.

FIG. 22 is a circuit diagram showing the structure of embodiment 6, wherein the MOS-IC of the invention is applied to a bus driver. The bus driver is a circuit which is suited for the application of the invention, since drivers for driving large capacitors perform switching at the same time.

In this embodiment, tri-state buffers (2100, 2101 . . . 2160, 2161) operating at the upper level and tri-state buffers (2102, 2103 . . . 2162, 2163) operating at the lower level are connected to an enable signal line EN,and a disenable signal line #EN respectively, and laid out every two bits as shown in the figure. In an actual layout, the buffers are laid out in order of bit.

Figure 23:
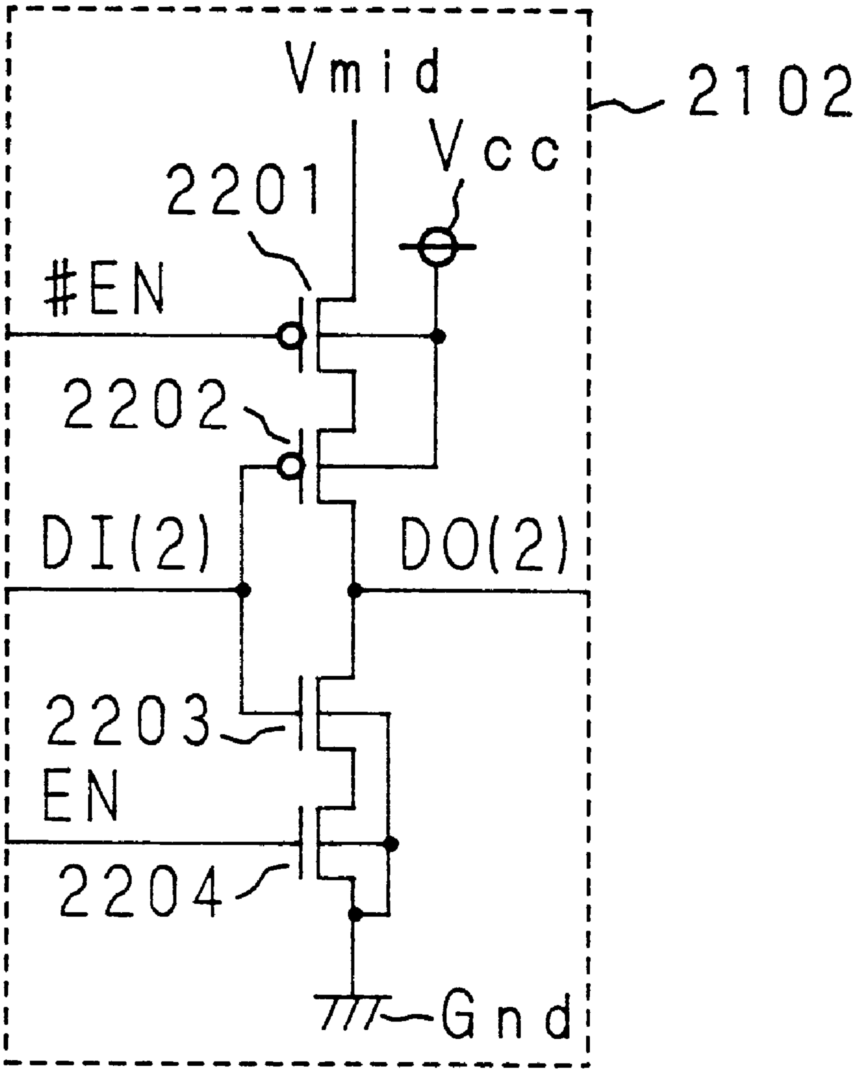
FIG. 23 is a circuit diagram showing the structure of a tri-state buffer.

FIG. 23 is a circuit diagram showing the structure of the tri-state buffer 2102 operating at the lower level. P-ch Trs 2201 and 2202 and N-ch Trs 2203 and 2204 are connected in series. The substrates of the P-ch Trs 2201 and 2202 are connected to the power source Vcc and the substrates of the N-ch Trs 2203 and 2204 are grounded. The source of the P-ch Tr 2201 is connected to the middle potential node and the gate thereof is connected to the disenable signal line #EN. The source of the N-ch Tr 2204 is grounded, and the gate thereof is connected to the enable signal line EN. The gate of the P-ch Tr 2202 is connected to the gate of the N-ch Tr 2203 and the connecting point is used as an input node DI (2). In addition, the connecting point of the drains of the two Trs is used as an output node DO (2).

In the tri-state buffer 2102, when the enable signal line EN has the level of the middle potential Vmid, the P-ch Tr 2201 and the N-ch Tr 2204 turn on, and the P-ch Tr 2202 and the N-ch Tr 2203 are made operable. When the enable signal line EN has the level of the ground potential Gnd, the P-ch Tr 2201 and the N-ch Tr 2204 turn off, and the P-ch Tr 2202 and the N-ch Tr 2203 do not operate.

Figure 24:
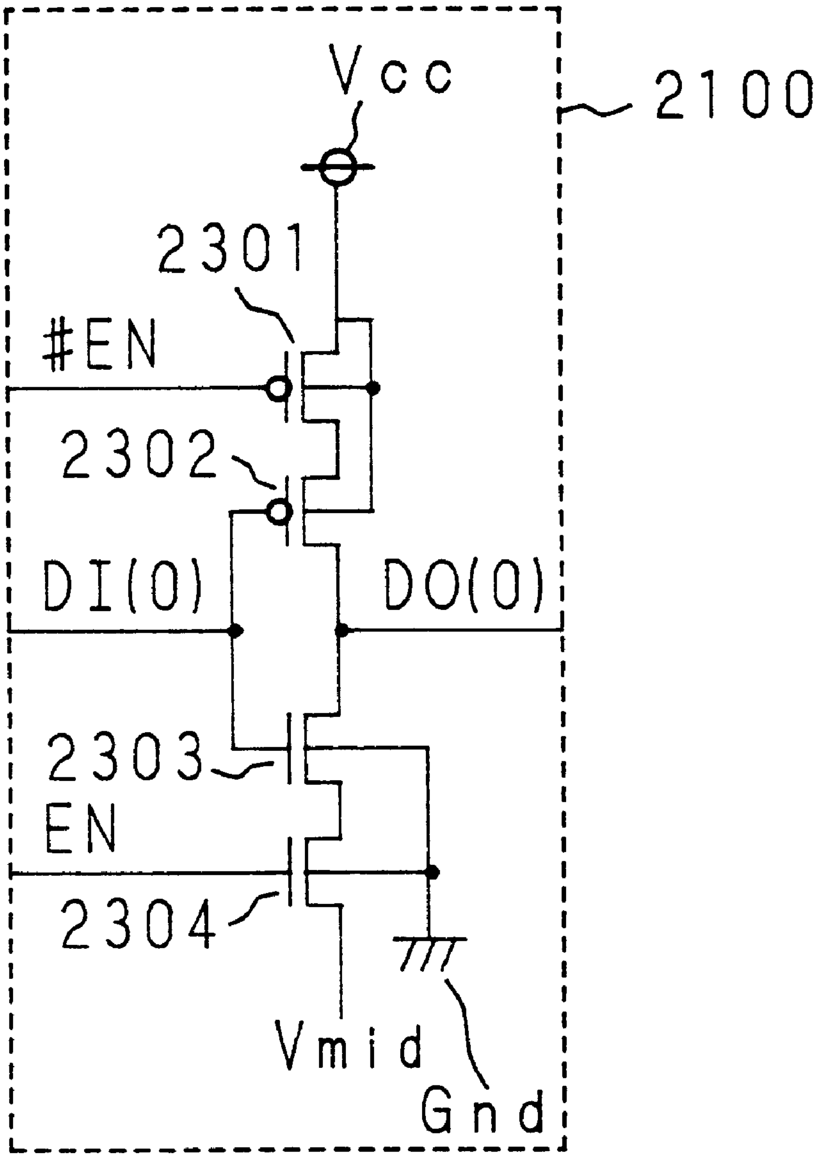
FIG. 24 is a circuit diagram showing the structure of a tri-state buffer.

FIG. 24 is a circuit diagram showing the structure of the tri-state buffer 2100 operating at the upper level. P-ch Trs 2301 and 2302 and N-ch Trs 2303 and 2304 are connected in series. The substrates of the P-ch Trs 2301 and 2302 are connected to the power source Vcc and the substrates of the N-ch Trs 2303 and 2304 are grounded. The source of the P-ch Tr 2301 is connected to the power source Vcc and the gate thereof is connected to the disenable signal line #EN. The source of the N-ch Tr 2304 is connected to the middle potential node and the gate thereof is connected to the enable signal line EN. The gate of the P-ch Tr 2302 is connected to the gate of the N-ch Tr 2303 and used as an input node DI (0). In addition, the connecting point of the drains of the two Trs is used as an output node DO (0).

In the tri-state buffer 2100, when the enable signal line EN has the level of the source potential Vcc, the P-ch Tr 2301 and the N-ch Tr 2304 turn on, and the P-ch Tr 2302 and the N-ch Tr 2303 are made operable. When the enable signal line EN is at the level of the middle potential Vmid, the P-ch Tr 2301 and the N-ch Tr 2304 turn off, and the P-ch Tr 2302 and the N-ch Tr 2303 do not operate.

In the bus driver of this embodiment, tri-state buffers are divided into a plurality of groups and laid out. Consequently when compared with the case wherein the entire bus driver is halved at the center bit, the layout is advantageous in that the delay due to wire resistance during the time of electrical charge supply at the middle potential node hardly occurs. Although buffers laid out every two bits are taken in the embodiment, it is obvious that a similar effect can be obtained by buffers laid out every one bit or every four bits.

Since the structure and operation of the MOS-IC of the embodiment 6 are similar to those of the embodiment 1 except those described above, any further description is omitted.

Embodiment 7

Figure 25:
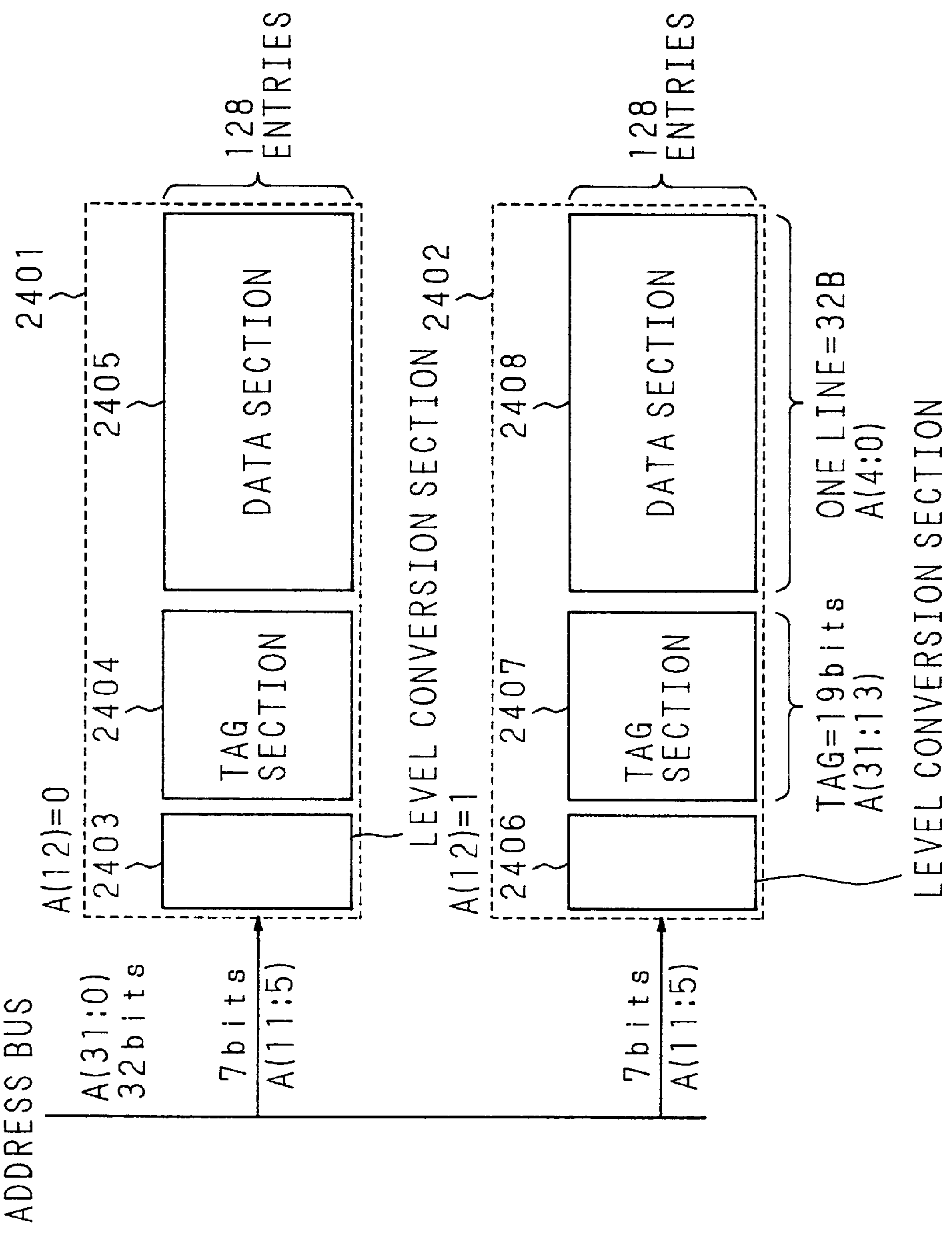
FIG. 25 is a block diagram showing the structure of an embodiment, wherein the MOS-IC of the invention is applied to a full-associative cache memory.

FIG. 25 is a block diagram showing the structure of embodiment 7, wherein the MOS-IC of the invention is applied to a full-associative cache memory. This embodiment has a memory capacity of 8KB, a line size of 32B and 256 entries. A (4:0) is used to represent a byte position in the line of 32B, A (11:5) is used to select an entry, and A (31:13) is used to compare address tags.

All entries are divided into two 128 entries. When A (12)=0, the entry for a circuit 2401 operating at the upper level is selected. When A (12)=1, the entry for a circuit 2402 operating at the lower level is selected.

A (11:5) on the address bus represents a full-swing level. The level is inputted to level conversion sections 2403 and 2406, and converted into the upper level and the lower level respectively. After level conversion, address decoding is performed. By address decoding, only one entry is selected from among 256 entries, and the address tag and data for the entry are read. When the tag for the entry coincides with A (31:13) on the address bus, the data is outputted to the data bus.

In this example, since only one entry is activated, the circuit 2401 operating at the upper level and the circuit 2402 operating at the lower level do not operate simultaneously in cases other than level conversion and address decoding. However, it is possible to save standby current or the like when the cache memory is not accessed.

Since the structure and operation of the MOS-IC of the embodiment 7 is similar to those of the above-mentioned embodiment 1 except those described above, any further description is omitted.

Embodiment 8

Figure 26:
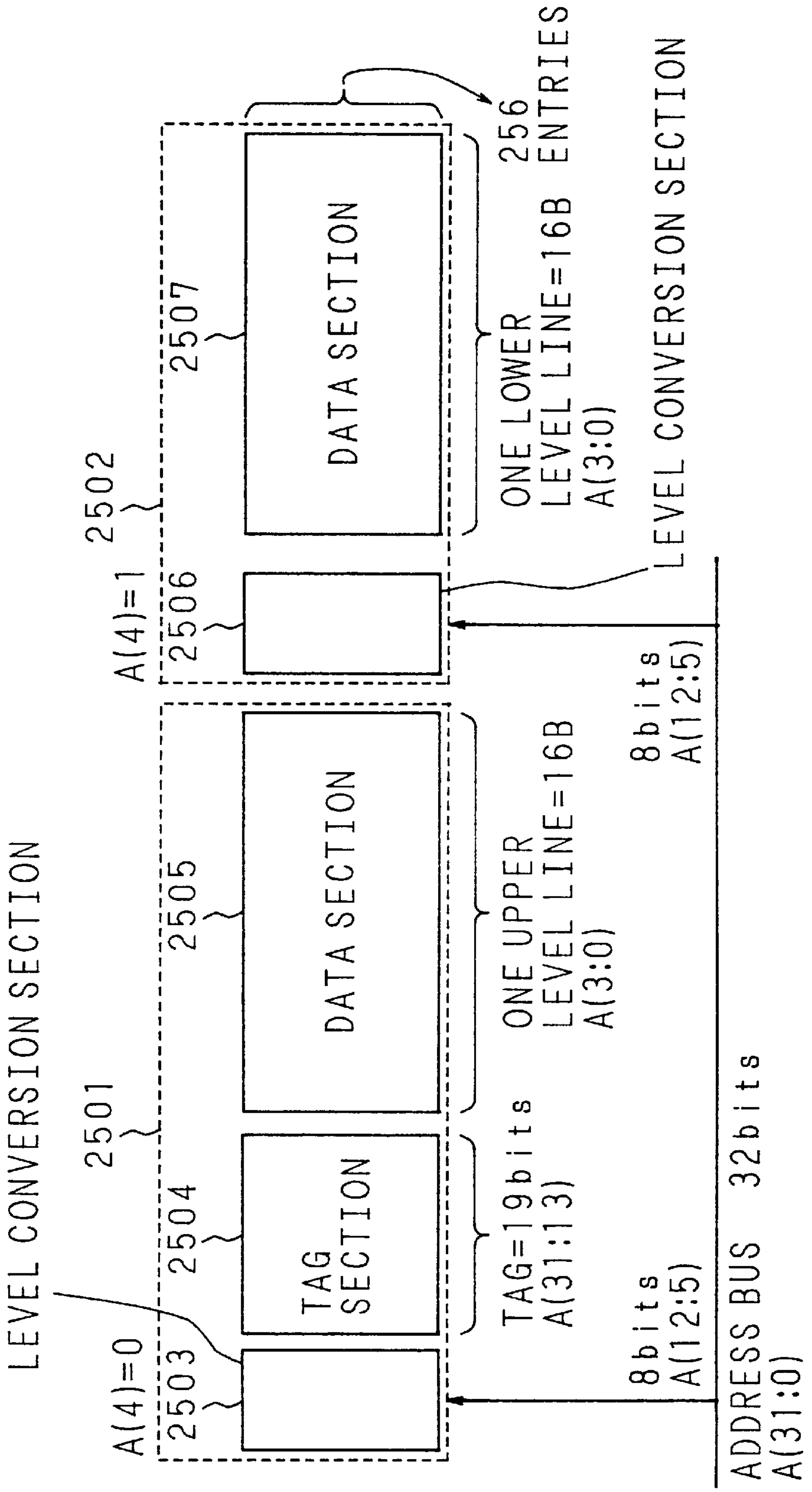
FIG. 26 is a block diagram showing the structure of another embodiment, wherein the MOS-IC of the invention is applied to a full-associative cache memory.

FIG. 26 is a block diagram showing the structure of another embodiment, wherein the MOS-IC of the invention is applied to a full-associative cache memory. The cache memory of this embodiment has a capacity of 8KB, a line size of 32B (16B+16B) and 256 entries. A (3:0) is used to represent a byte position in the line of 16B, A (4) is used to select the upper level or the lower level, A (12:5) is used to select an entry, and A (31:13) is used to compare address tags. The line selected at the upper level completely matches the line selected at the lower level.

A (12:5) on the address bus represents a full-swing level. The level is inputted to level conversion sections 2503 and 2506, and converted into the upper level and the lower level respectively. After level conversion, address decoding is performed. By address decoding, the same entry is selected at the circuit 2501 for the upper level and the circuit 2502 for the lower level. These two level conversion circuits have the same function except that there is a difference in the operating potential level.

By entry selection, the address tag and data for the entry are read at the upper level, and the data for the entry is read at the lower level. When the tag for the entry coincides with A (31:13) on the address bus, the data is outputted to the data bus.

In this example, although only one entry is activated, data reading is performed together with level conversion and address decoding, unlike the case shown in FIG. 25. For this reason, current can be reused efficiently. In addition, like the case shown in FIG. 25, it is possible to save standby current or the like when the cache is not accessed.

Since the structure and operation of the MOS-IC of the embodiment 8 is similar to those of the above-mentioned embodiment 1 except those described above, any further description is omitted.

FIGS. 25 and 26 are schematic drawings showing the functions of the cache memory. When the circuits operating at the upper level and the circuits operating at the lower level are laid out alternately in appropriate bit units as in the example of the bus driver shown in FIG. 22, this layout is advantageous in that the delay due to wire resistance during the time of electrical charge supply to the middle potential node hardly occurs.

Although a cache memory is taken in the above description, it is obvious that the same effect can be obtained for memories, such as ROM, DRAM and SRAM, by forming the upper level and the lower level into the above-mentioned divided structures.

Embodiment 9

Figure 27:
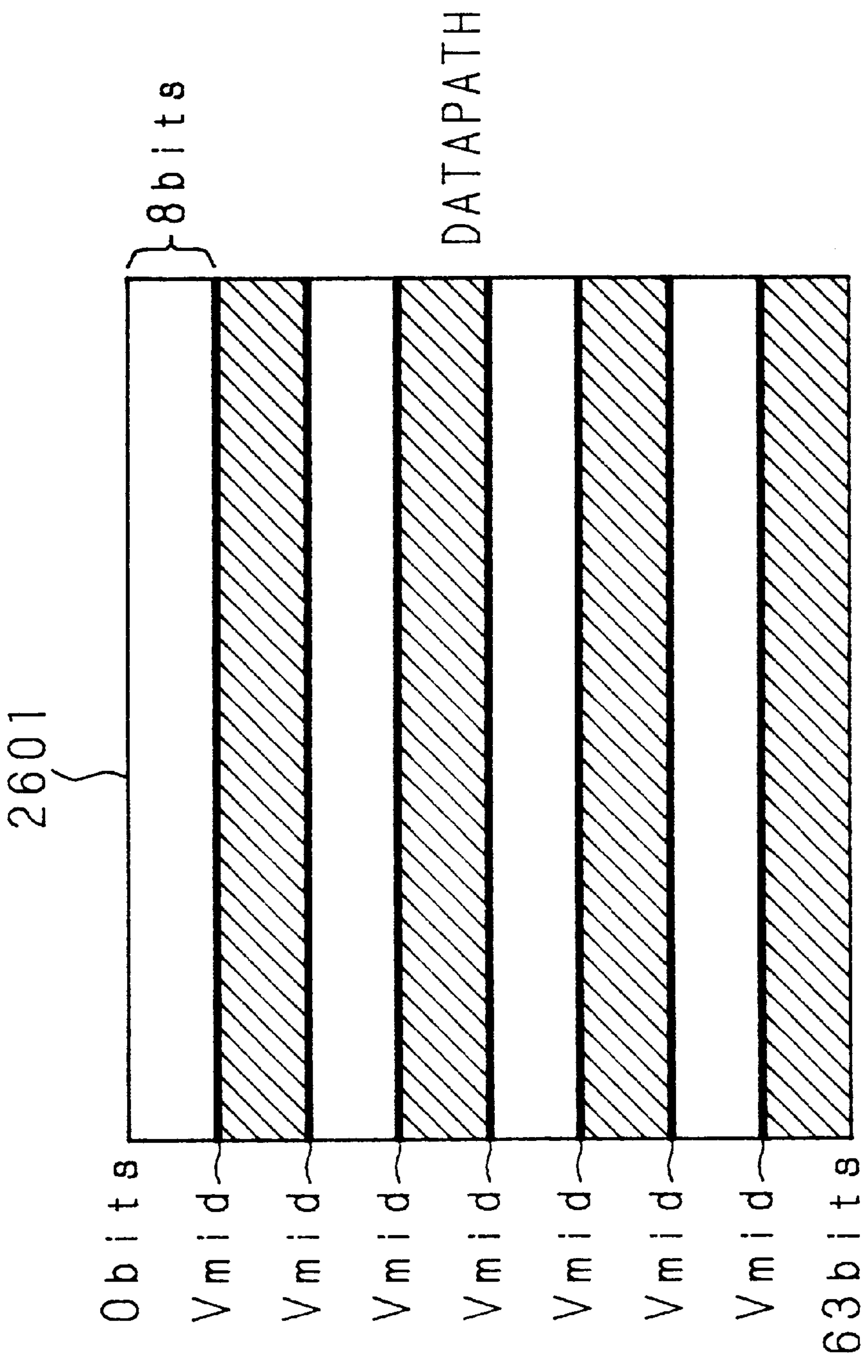
FIG. 27 is a layout view showing the structure of an embodiment, wherein the MOS-IC of the invention is applied to a datapath layout.

FIG. 27 is a layout drawing showing the structure of an embodiment wherein the MOS-IC of the invention is applied to the datapath layout used for a microcomputer IC, a signal processing IC, etc. In the datapath 2601 of this embodiment, portions operating at the upper level and portions operating at the lower level are laid out alternately in eight bit units. A thick trunk line of the middle potential node is disposed at the position where the portion operating at the upper level faces the portion operating at the lower level.

Although the circuits are laid out in 8 bit units in this embodiment, it is needless to say that the layout is possible in appropriate bit units. When the circuits operating at the upper level and the circuits operating at the lower level are laid out alternately in appropriate bit units, this layout is advantageous in that the delay due to wire resistance during the time of electrical charge supply to the middle potential node hardly occurs.

Embodiment 10

Figure 28:
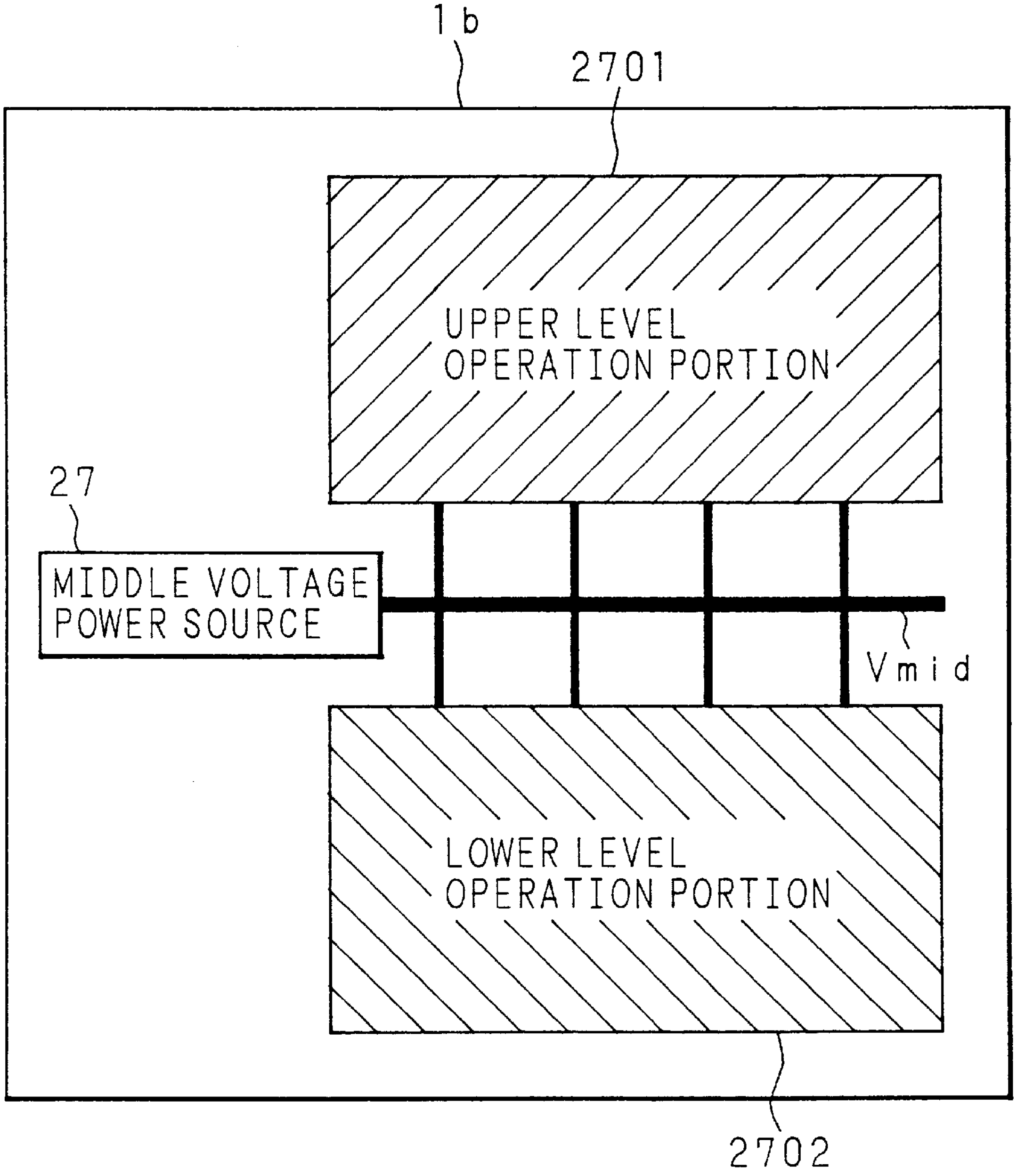
FIG. 28 is a block diagram showing the structure of an embodiment, wherein the invention is applied to the whole of the MOS-IC.

FIG. 28 is a block diagram showing the structure of an embodiment, wherein the invention is applied to the entire MOS-IC. One half of the main operation portion of the MOS-IC 1*b* of this embodiment corresponds to a upper level operation portion 2701 (first operation circuit) and the other half corresponds to a lower level operation portion 2702 (second operation circuit). At other portions, full-swing operation is performed. Appropriate signal level conversion circuits are inserted between the upper level operation portion 2701 and the I/O buffer of the MOS-IC 1*b*, and between the lower level operation portion 2702 and the I/O buffer of the MOS-IC 1*b* respectively. In addition, a thick trunk wire of the middle potential node is disposed between the upper level operation portion 2701 and the lower level operation portion 2702.

Although the current consumed by the upper level operation portion 2701 rarely coincides with the current consumed by the lower level operation portion 2702, a considerable proportion of current can be reused on average.

Although the MOS-IC 1*b* is laid out in a two-part split condition in this embodiment, it is needless to say that a similar effect can be obtained even when the MOS-IC 1*b* is split into more than two pieces. When the MOS-IC 1*b* is split appropriately, and the portions operating at the upper level and the portions operating at the lower level are laid out alternately, this layout is advantageous in that the delay due to wire resistance during the time of electrical charge supply at the middle potential node hardly occurs.

Embodiment 11

Figure 29:
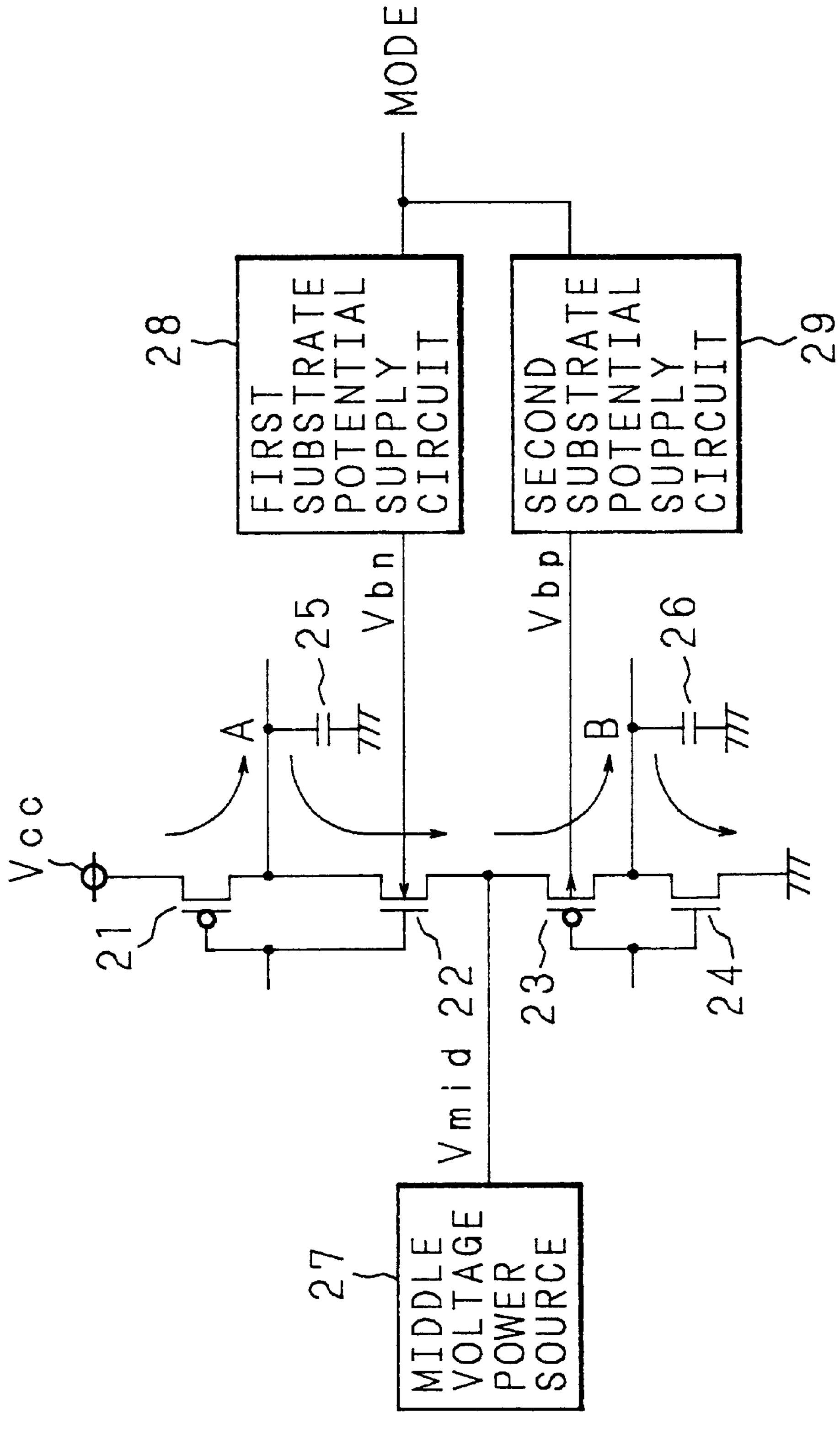
FIG. 29 is a block diagram explaining a substrate potential supply system of a transistor whose source receives the middle potential.

FIG. 29 is a block diagram explaining the supply system of a substrate potential of a transistor of a MOS-IC, to whose source the middle potential is applied, according to an embodiment 11. The drain of a P-ch Tr 21 is connected to the drain of an N-ch Tr 22, and the source of the P-ch Tr 21 is connected to the power source Vcc. The drain of a P-ch Tr 23 is connected to the drain of an N-ch Tr 24, and the source of the N-ch Tr 24 is grounded. In these inverters, the source of the N-ch Tr 22 is connected to the source of the P-ch Tr 23.

The connection node of the N-ch Tr 22 and the P-ch Tr 23 is, for example, connected to the output terminal of a middle voltage power source (node stabilization circuit) 27 which outputs a middle potential Vmid, a half of the source potential Vcc, and the output is used as a middle voltage node. A substrate potential Vbp is applied from a second substrate potential supply circuit 29 to the substrate of the P-ch Trs 23. A substrate potential Vbn is applied from a first substrate potential supply circuit 28 to the substrate of the N-ch Trs 22.

The first and second substrate potential supply circuits receive a mode switching signal for switching modes; one is a high speed mode wherein a first and a second operation circuits operate at a high speed, and the other is a low power consumption mode wherein the first and second operation circuits operate with a low power.

A parasitic load capacitor 25 is present at connection node A (the output node of the inverter) of the P-ch Tr 21 and the N-ch Tr 22. A parasitic load capacitor 26 is present at connection node B of the P-ch Tr 23 and the N-ch Tr 24.

The inverter comprising the P-ch Tr 21 and the N-ch Tr 22 is an example of the first operation circuit, and a single inverter is shown representatively to simplify the circuit. This inverter operates at the upper level in the range of the source potential Vcc to the middle potential Vmid. On the other hand, the inverter comprising the P-ch Tr 23 and the N-ch Tr 24 is an example of the second operation circuit, and a single inverter is shown representatively to simplify the circuit. This inverter operates at the lower level in the range of the middle potential Vmid to the ground potential Gnd.

FIG. 29 shows the structure in which the first and second substrate potential supply circuits are added to the components in FIG. 3. In the N-ch Tr 22 shown in FIG. 3 of the embodiment 1, to the source of which the middle voltage Vmid is applied, the potential at the substrate thereof is not set at the middle potential Vmid but set at the ground potential Gnd. As above-mentioned, this is because the driving capability is not only stabilized, but also in creased, in case at the substrate is grounded. In addition, when the potential at the substrate is lowered, threshold voltage Vth is raised by a substrate effect, being effective in decreasing leak current. Furthermore, when the substrate is grounded, the MOS-IC can be laid out easily.

Due to the same reason, in the P-ch Tr 23, to the source of which the middle voltage Vmid is applied, the potential at the substrate thereof is not set at the middle potential Vmid but set at the source potential Vcc.

When the potential at the substrate of the N-ch Tr 22 is grounded, to the source thereof the middle potential Vmid is applied, and the potential at the substrate of the P-ch Tr 23 is at the source potential Vcc, to the source thereof the middle potential Vmid is applied, as shown in FIG. 3, however the operation speed is reduced. Consequently, in the embodiment 11 a high speed mode wherein the first and second operation circuits operate at the high speed, but the leak current is relatively large, and a low power consumption mode wherein the first and second operation circuits operate with a low power, but at a low speed, are set, these modes are switched according to the mode switching signal MODE.

Hence, in case that the first and second operation circuits are to operate at the high speed, when the mode switching signal MODE from outside is set at the high speed mode, the first substrate potential supply circuit 28 changes the substrate potential of the N-ch Tr 22 to an arbitrary potential higher than the ground potential GND. The second substrate potential supply circuit 29 changes the substrate potential of the P-ch Tr 23 to an arbitrary potential lower than the source potential Vcc. Consequently the threshold voltage Vth of the N-ch Tr 22 falls, the threshold voltage Vth of the P-ch Tr 23 raises, whereby the operation speed in each element rises.

On the other hand, in case that the first and second operation circuits are to operate at the low speed, when the mode switching signal MODE from outside is set at the low consumption mode, the first substrate potential supply circuit 28 changes the substrate potential of the N-ch Tr 22 to the ground potential GND. The second substrate potential supply circuit 29 changes the substrate potential of the P-ch Tr 23 to the source potential Vcc. Consequently the threshold voltage Vth of the N-ch Tr 22 raises, the threshold voltage Vth of the P-ch Tr 23 falls, whereby the leak current in each element is decreased.

Figure 30:
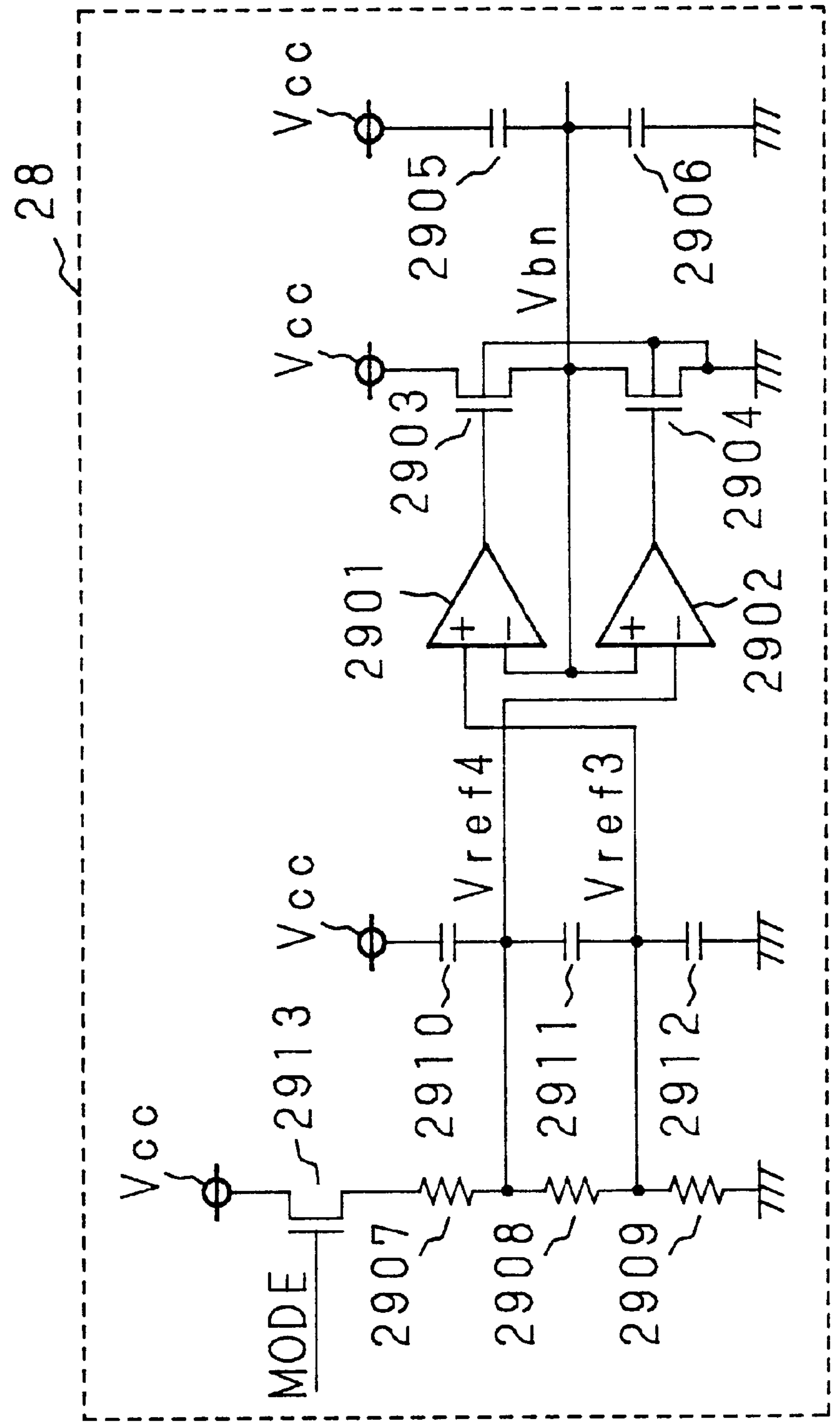
FIG. 30 is a circuit diagram showing a structure of a first substrate potential supply circuit.

FIG. 30 is a circuit diagram showing the structure of the first substrate potential supply circuit 28. The first substrate potential supply circuit 28 comprises an N-ch Tr 2913 and three resistors 2907, 2908 and 2909 connected in series, three capacitors 2910, 2911 and 2912 connected in series, two N-ch Trs 2903, 2904 connected in series, two capacitors 2905 and 2906 connected in series, these being connected in parallel between the power source Vcc and the ground Gnd, and further comprises OP-amps 2901 and 2902. A mode switching signal MODE is applied to the gate of the N-ch Tr 2913 from outside. The connecting point of the resistors 2907 and 2908 is connected to the connecting point of the capacitors 2910 and 2911 and to the inverting input terminal of the OP-amp 2902. The connecting point of the resistors 2908 and 2909 is connected to the connecting point of the capacitors 2911, 2912 and to the noninverting input terminal of the OP-amp 2901.

When the N-ch Tr 2913 is on, the potential obtained by dividing the source voltage by the resistance ratio between the resistors 2907 and 2908 and the resistor 2909 is applied from the connecting point of the resistors 2908 and 2909 to the noninverting input terminal of the OP-amp 2901 as a third reference potential Vref3. When the N-ch Tr 2913 is on, the potential obtained by dividing the source voltage by the resistance ratio between the resistor 2907 and the resistors 2908 and 2909 is applied from the connecting point of the resistors 2907 and 2908 to the inverting input terminal of the OP-amp 2902 as a fourth reference potential Vref4.

The output terminal of the OP-amp 2901 is connected to the gate of the N-ch Tr 2903 and the output terminal of the OP-amp 2902 is connected to the gate of the N-ch Tr 2904. The substrates of the N-ch Trs 2903 and 2904 are grounded. The inverting input terminal of the OP-amp 2901 is connected to the noninverting input terminal of the OP-amp 2902. This connecting point is connected to the connecting point of the N-ch Trs 2903 and 2904 and the connecting point of the capacitors 2905 and 2906, and from the point a substrate potential Vbn of the N-ch Tr 22 is outputted.

The third and fourth reference potentials Vref3 and Vref4 are determined by the ratios obtained by the values of the resistors 2907, 2908 and 2909. The relationship between the third reference potential Vref3 and the fourth reference potential Vref4 is given by Vref4>Vref3.

In the first substrate potential supply circuit 28, when the mode switching signal MODE of H-level which is in the high speed mode is applied to the gate of the N-ch Tr 2913, the N-ch Tr 2913 turns on, and the voltage which is the difference between the third and fourth reference potential Vref3 and Vref4 is outputted as the substrate potential (voltage) Vbn of the N-ch Tr 22. When the substrate potential Vbn of the N-ch Tr 22 drops lower than the third reference potential Vref3, the OP-amp 2901 detects the drop and the N-ch Tr 2903 turns on. By this operation, electrical charges are supplied to the substrate of the N-ch Tr 22. Conversely, when the substrate potential Vbn of the N-ch Tr 22 rises higher than the fourth reference potential Vref4, the OP-amp 2902 detects the rise and the N-ch Tr 2904 turns on. By this operation, electrical charges are removed from the substrate of the N-ch Tr 22.

In the first substrate potential supply circuit 28, the two OP-amps 2901 and 2902 do not operate in the range (dead band) between the third reference potential Vref3and the fourth reference potential Vref4. In this range, the electrical charges of the capacitors 2905 and 2906 are used to stabilize the substrate potential Vbn of the N-ch Tr 22. As the result, the first substrate potential supply circuit 28 is prevented from reacting too sensitively.

The capacitors 2905 and 2906 have capacitances enough to stabilize the substrate potential Vbn of the N-ch Tr 22, and are almost the same in size. Since the capacitors 2905 and 2906 are connected to the substrate of the N-ch Tr 22, the influence caused when the source potential Vcc or the ground potential Gnd fluctuates is reduced and the substrate potential Vbn of the N-ch Tr 22 is stabilized. In addition, the capacitors 2910, 2911 and 2912 have capacitances enough to stabilize the third reference potential Vref3 and the fourth reference potential Vref4.

In the first substrate potential supply circuit 28, when the mode switching signal MODE of L-level which is in the low power consumption mode is applied to the gate of the N-ch Tr 2913, the N-ch Tr 2913 turns off, and the third and fourth reference potential Vref3 and Vref4 drop. The OP-amp 2901 detects the drop and the N-ch Tr 2903 turns off. The OP-amp 2902 detects the drop and the N-ch Tr 2904 turns on. As the result, the ground potential GND is outputted as the substrate potential Vbn of the N-ch Tr 22.

Figure 31:
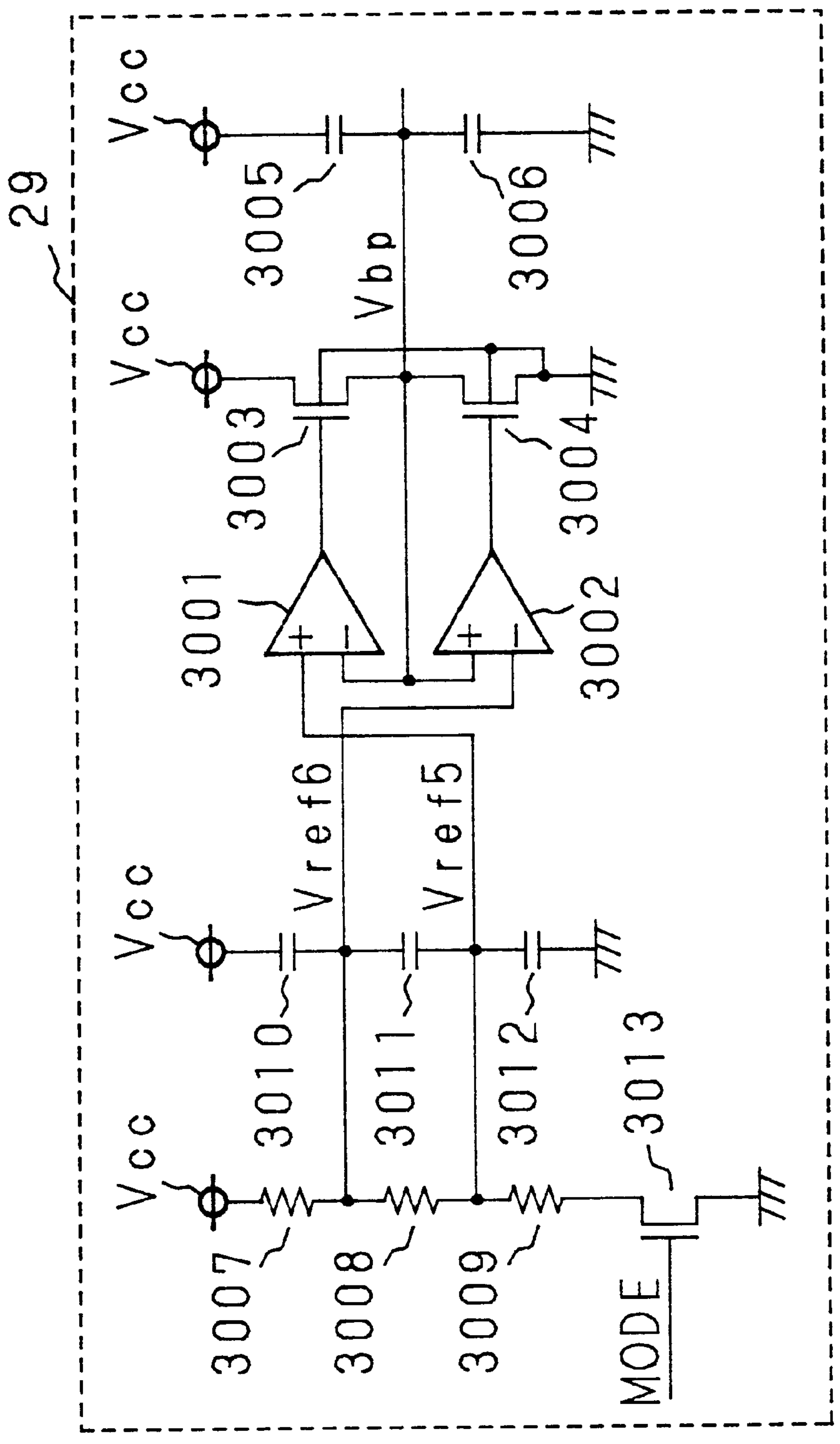
FIG. 31 is a circuit diagram showing a structure of a second substrate potential supply circuit.

FIG. 31 is a circuit diagram showing the structure of second substrate potential supply circuit 29. The second substrate potential supply circuit 29 comprises three resistors 3007, 3008 and 3009 and a N-ch Tr 3013 connected in series, three capacitors 3010, 3011 and 3012 connected in series, two N-ch Trs 3003, 3004 connected in series, two capacitors 3005 and 3006 connected in series, these being connected in parallel between the power source Vcc and the ground Gnd, and further comprises OP-amps 3001 and 3002. The mode switching signal MODE is applied to the gate of the N-ch Tr 3013 from outside. The connecting point of the resistors 3007 and 3008 is connected to the connecting point of the capacitors 3010 and 3011 and to the inverting input terminal of the OP-amp 3002. The connecting point of the resistors 3008 and 3009 is connected to the connecting point of the capacitors 3011, 3012 and to the noninverting input terminal of the OP-amp 3001.

The potential obtained by dividing the source voltage by the resistance ratio between the resistors 3007 and 3008 and the resistor 3009 is applied from the connecting point of the resistors 3008 and 3009 to the noninverting input terminal of the OP-amp 3001 as a fifth reference potential Vref5. The potential obtained by dividing the source voltage by the resistance ratio between the resistor 3007 and the resistors 3008 and 3009 is applied from the connecting point of the resistors 3007 and 3008 to the inverting input terminal of the OP-amp 3002 as a sixth reference potential Vref6.

The output terminal of the OP-amp 3001 is connected to the gate of the N-ch Tr 3003 and the output terminal of the OP-amp 3002 is connected to the gate of the N-ch Tr 3004. The substrates of the N-ch Trs 3003 and 3004 are grounded. The inverting input terminal of the OP-amp 3001 is connected to the noninverting input terminal of the OP-amp 3002. This connecting point is connected to the connecting point of the N-ch Trs 3003 and 3004 and the connecting point of the capacitors 3005 and 3006, and from the point a substrate potential Vbp of the P-ch Tr 23 is outputted. The fifth and sixth reference potentials Vref5 and Vref6 are determined by the values of the resistors 3007, 3008 and 3009. The relationship between the fifth reference potential Vref5 and the sixth reference potential Vref6 is given by Vref6>Vref5.

In the second substrate potential supply circuit 29, when the mode switching signal MODE of H-level which is in the high speed mode is applied to the gate of the N-ch Tr 3013, the N-ch Tr 3013 turns on, and the voltage which is the difference between the fifth and sixth reference potential Vref5 and Vref6 is outputted as the substrate potential (voltage) Vbp of the P-ch Tr 23. Then the substrate potential Vbp of the P-ch Tr 23 drops lower than the fifth reference potential Vref5, the OP-amp 3001 detects the drop and the N-ch Tr 3003 turns on. By this operation, electrical charges are supplied to the substrate of the P-ch Tr 23. Conversely, when the substrate potential Vbp of the P-ch Tr 23 rises higher than the sixth reference potential Vref6, the OP-amp 3002 detects the rise and the N-ch Tr 3004 turns on. By this operation, electrical charges are removed from the substrate of the P-ch Tr 23.

In the second substrate potential supply circuit 29, the two OP-amps 3001 and 3002 do not operate in the range (dead band) between the fifth reference potential Vref5 and the sixth reference potential Vref6. In this range, the electrical charges of the capacitors 3005 and 3006 are used to stabilize the substrate potential Vbp of the P-ch Tr 23. As the result, the second substrate potential supply circuit 29 is prevented from reacting too sensitively.

The capacitors 3005 and 3006 have capacitances enough to stabilize the substrate potential Vbp of the P-ch Tr 23, and are almost the same in size. Since the capacitors 3005 and 3006 are connected to the substrate of the P-ch Tr 23, the influence caused when the source potential Vcc or the ground potential Gnd fluctuates is reduced and the substrate potential Vbp of the P-ch Tr 23 is stabilized. In addition, the capacitors 3010, 3011 and 3012 have capacitances enough to stabilize the fifth reference potential Vref5 and the sixth reference potential Vref6.

In the second substrate potential supply circuit 29, when the mode switching signal MODE of L-level which is in the low power consumption mode is applied to the gate of the N-ch Tr 3013, the N-ch Tr 3013 turns off, and the fifth and sixth reference potential Vref5 and Vref6 drop. The OP-amp 3001 detects the drop and the N-ch Tr 3003 turns off. The OP-amp 3002 detects the drop and the N-ch Tr 3004 turns on. As the result, the source potential Vcc is outputted as the substrate potential Vbp of the P-ch Tr 23.

Since the other structure and the operation of the MOS-IC of the embodiment 11 are similar to the structure and the operation of the embodiment 1, the description is omitted.

Embodiment 12

Figure 32:
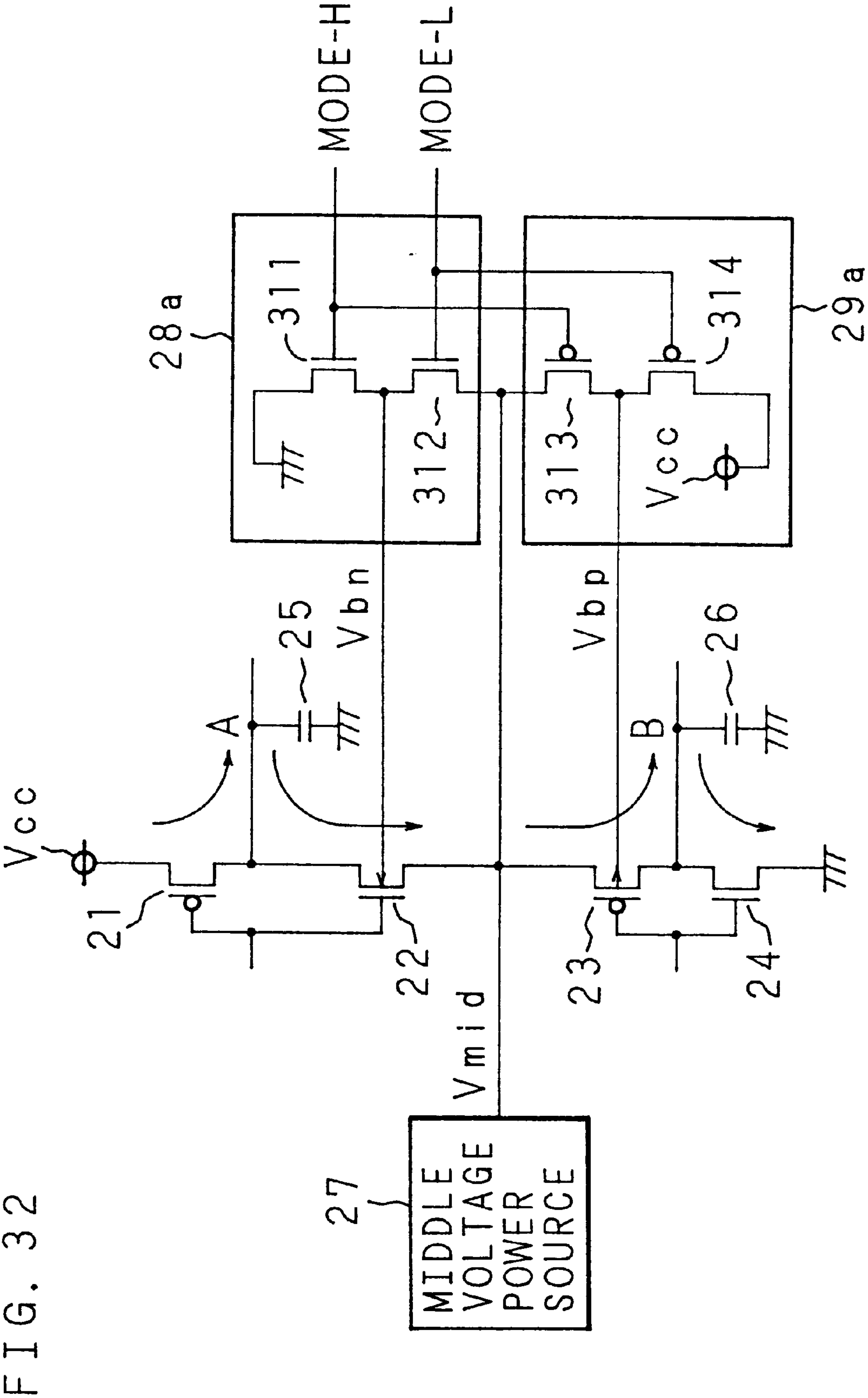
FIG. 32 is a block diagram explaining another substrate potential supply system of a transistor whose source receives the middle potential.

FIG. 32 is a block diagram explaining another supply system of a substrate potential of a transistor of a MOS-IC, to whose source the middle potential is applied, according to an embodiment 12. In this MOS-IC, a substrate potential Vbp of a P-ch Tr 23 is supplied from a second substrate potential supply circuit 29*a*, a substrate potential Vbn of a N-ch Tr 22 is supplied from a first substrate potential supply circuit 28*a*.

The first substrate potential supply circuit 28*a* includes an N-ch Tr 311 whose source is grounded and an N-ch Tr 312 whose source is connected to the middle potential node. The N-ch Trs 311 and 312 are connected in series, and the connecting point is connected to the substrate of the N-ch Tr 22.

The second substrate potential supply circuit 29*a* includes a P-ch Tr 314 whose source is connected to the power source Vcc and a P-ch Tr 313 whose source is connected to the middle potential node. The P-ch Trs 313 and 314 are connected in series, and the connecting point is connected to the substrate of the P-ch Tr 23.

A mode switching signal MODE-H is applied to gates of the N-ch Tr 311 and the P-ch Tr 313. An inverted signal MODE-L obtained by inverting the mode switching signal MODE-H is applied to gates of the N-ch Tr 312 and the P-ch Tr 314.

In the first substrate potential supply circuit 28*a*, when the mode switching signal MODE-H of H-level which corresponds to the low power consumption mode is applied to the gate of the N-ch Tr 311, the N-ch Tr 311 turns on, and the N-ch Tr 312 turns off. As the result, the ground potential GND is outputted as the substrate potential Vbn of the N-ch Tr 22. At this time, in the second substrate potential supply circuit 29*a*, the P-ch Tr 313 turns off, and the P-ch Tr 314 turns on. As the result, the source potential Vcc is outputted as the substrate potential Vbp of the P-ch Tr 23.

In the first substrate potential supply circuit 28*a*, when the mode switching signal MODE-H of L-level which corresponds to the high speed mode is applied to the gate of the N-ch Tr 311, the N-ch Tr 311 turns off, and the N-ch Tr 312 turns on. As the result, the middle potential Vmid is outputted as the substrate potential Vbn of the N-ch Tr 22. At this time, in the second substrate potential supply circuit 29*a*, the P-ch Tr 313 turns on, and the P-ch Tr 314 turns off. As the result, the middle potential Vmid is outputted as the substrate potential Vbp of the P-ch Tr 23.

Since the other structure and the operation of the MOS-IC of the embodiment 12 are similar to the structure and the operation of the embodiment 11, the description is omitted.

In addition, although the embodiments 11 and 12 are described about the case that the substrate potential can be two kinds in the high speed mode and in the low power consumption mode, the substrate potential may be more than two kinds in the modes including another mode.

Moreover, although the above-mentioned embodiments are described with respect to the case that each of the first and second operation circuits includes one inverter, the same effect are obtained even when the first and second operation circuits have large scale.

Embodiment 13

Figure 33:
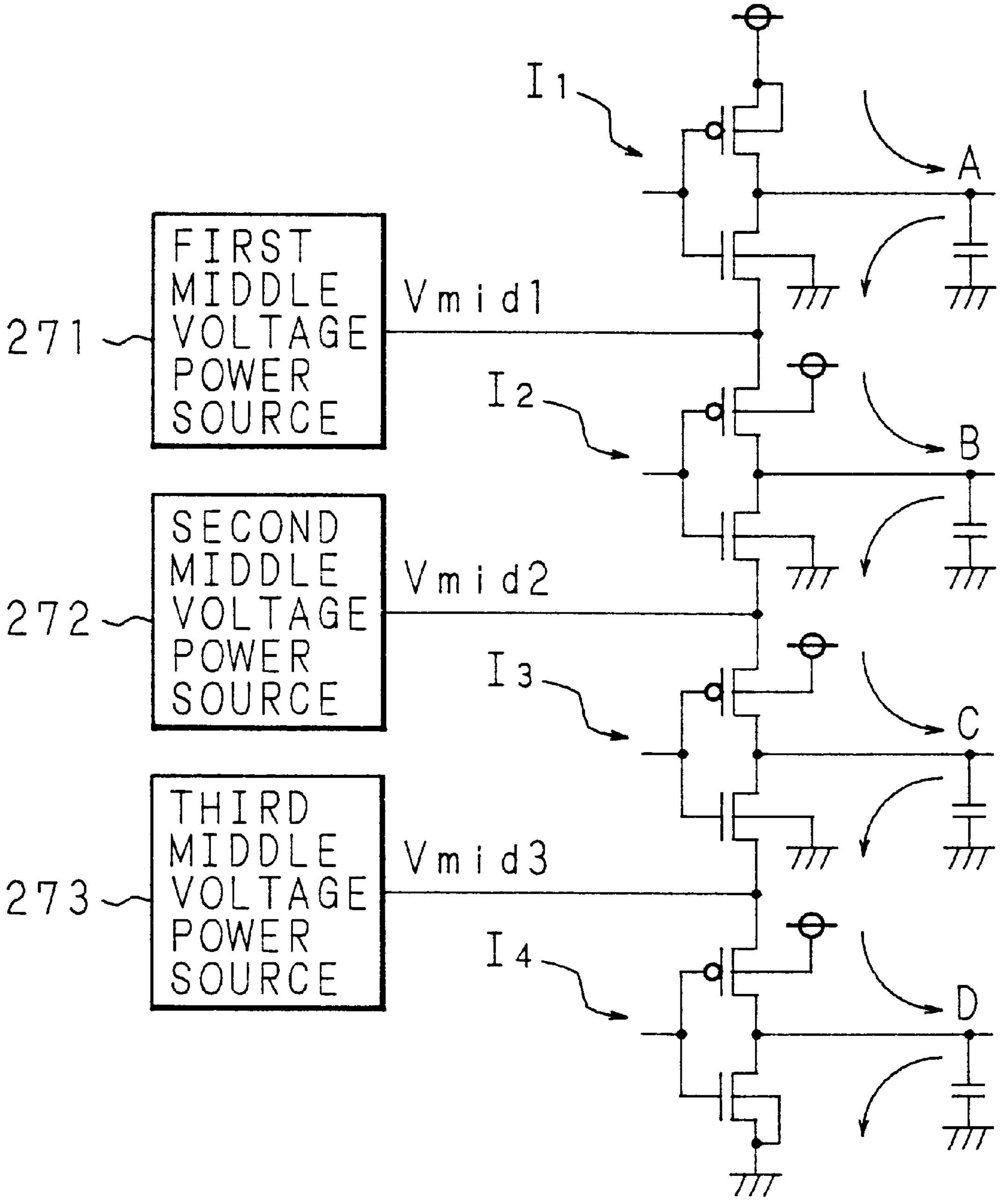
FIG. 33 is a block diagram showing the structure of a MOS-IC according to embodiment 13 of the present invention.

Although the range between the source potential Vcc and the ground potential Gnd is split into two portions: the upper level and the lower level, in all the embodiments described above, it is possible to split the range into three or more portions. FIG. 33 is a block diagram showing the structure of a MOS-IC according to embodiment 13. In this embodiment four inverters $I_1$, $I_2$, $I_3$ and $I_4$ are connected in series between a power source Vcc and ground GND. The connecting point of the inverters $I_1$, and $I_2$ is connected to an output terminal of a first middle voltage power source 271 for outputting a middle potential Vmid1. The connecting point of the inverters $I_2$ and $I_3$ is connected to an output terminal of a second middle voltage power source 272 for outputting a middle potential Vmid2. The connecting point of the inverters $I_3$ and $I_4$ is connected to an output terminal of a third middle voltage power source 273 for outputting a middle potential Vmid3. The structures of the inverters $I_1$, $I_2$, $I_3$ and $I_4$ are substantially similar to the structure shown in FIG 3, Parasitic load capacitors are respectively present at connection nodes (output nodes of inverters) A, B, C and D between two transistors forming inverters. The values of these middle potentials are set to be Vcc>Vmid1>Vmid2>Vmid3>GND. Hence the inverter 1 operates between the potentials Vcc and Vmid1, the inverter $I_2$ operates between the potentials Vmid1 and Vmid2, the inverter $I_3$ operates between the potentials Vmid2 and Vmid3, and the inverter $I_4$ operates between the potentials Vmid3 and GND. The following description is applicable when the capabilities and switching timings of the four inverters care the same, the capacitance values of parasitic load capacitors are the same. Moreover, the signal level transition directions at the nodes A and C are the same, and the signal level transition directions at the nodes B and D are the same. Further, the signal level transition directions at the nodes A and C are opposite to the signal level transition directions at the nodes B and D.

Figure 34:
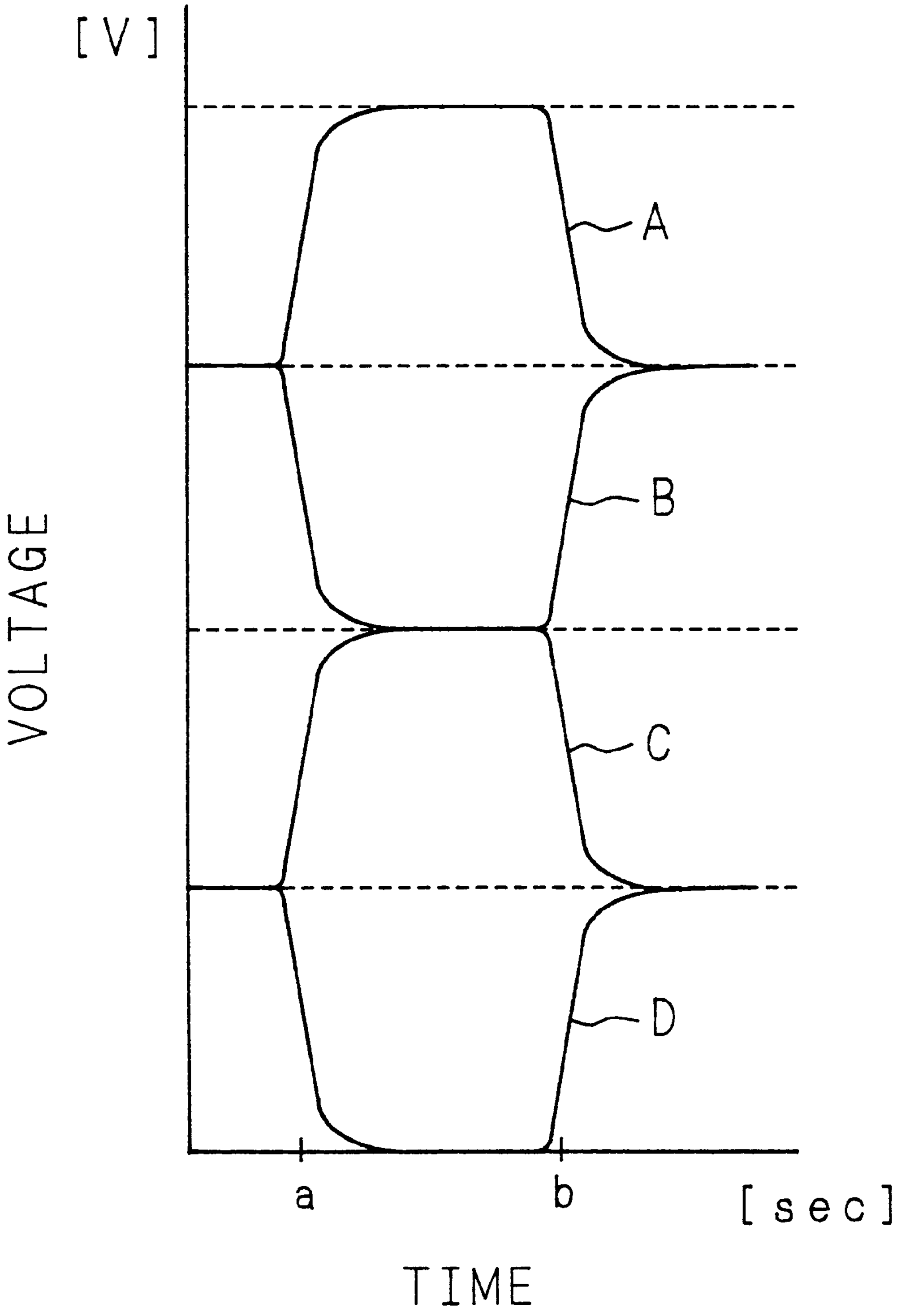
FIG. 34 is a diagram showing the output waveform of each operation circuit shown in FIG. 33.

The output waveforms of the four inverters are as shown in FIG. 34. The basic operation is similar to the embodiment 1 shown in FIGS. 3 and 4, and the electrical charges can be reused by re-distribution of the same. Since the three middle potentials are used in the embodiment 13, the utilization efficiency is double as the case shown in FIG. 3.

Although FIG. 34 shows an ideal waveform, in practice, operation scales and operation timings of circuits present between the plurality of voltage levels are often various. When the power source voltage is divided to multiple voltage levels, it is difficult to adjust the operations of circuits at the voltage levels and design the circuits so that the electrical charges are efficiently reused. Also, when the electrical charges are reused in low efficiency, it needs larger capability in electrical charges supply of the middle voltage power source. As the result the scale of the circuit becomes larger, thereby increasing the area of the IC.

To cope with the above problems, for example, there is a structure so that the middle potential Vmid2 among the plurality of potentials is supplied from outside. In this structure it needs only suitable adjustment between the upper two circuits (inverters $I_1$ and $I_2$) and between the lower two circuits (inverters $I_3$ and $I_4$), and it is needless to increase the scale of the middle voltage power source immoderately.

As the number of splits is larger, current can be reused more effectively. Furthermore, when three or more middle potentials are provided, a layout should be made, wherein the node of one middle potential supplied from the outside of the MOS-IC is sandwiched between the node of a power source side middle potential generated internally and the node of a ground side middle potential generated internally. This layout is advantageous in preventing the later two nodes from being affected by each other. This embodiment may be combined with the above embodiments.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A MOS integrated circuit operating on a first potential and a second potential, the first potential being larger than the second potential, and being externally supplied, comprising:

a middle potential node to be provided with a middle potential between said first potential and said second potential;

a first operation circuit including a circuit operating between said first potential and said middle potential;

a second operation circuit including a circuit operating between said middle potential and said second potential; and a node stabilization circuit for supplying and stabilizing the potential of said middle potential node such that said potential of said middle potential node does not diverge from the middle potential even when said first operation circuit and said second operation circuit are operated respectively.

2. A MOS integrated circuit according to claim 1, wherein said first potential is supplied to the substrates of P-channel transistors and said second potential is supplied to the substrates of N-channel transistors, said transistors being included in said first and second operation circuits.

3. A MOS integrated circuit according to claim 1, wherein said node stabilization circuit includes:

a first reference potential node to which a first reference potential having a value between said first and second potentials and for determining said middle potential is to be supplied;

a second reference potential node to which a second reference potential for determining said middle potential having a value between said first potential and said second potential and higher than said first reference potential is supplied;

first comparison means for comparing said first reference potential with said middle potential; and second comparison means for comparing said second reference potential with said middle potential, and operates to discharge said middle potential node when said middle potential is higher than said second reference potential and to charge said middle potential node when said middle potential is lower than said first reference potential.

4. A MOS integrated circuit according to claim 3, wherein said first potential is supplied to the substrates of P-channel transistors and said second potential is supplied to the substrates of N-channel transistors, said transistors being included in said first and second operation circuits.

5. A MOS integrated circuit according to claim 3, wherein said node stabilization circuit further includes a plurality of resistors connected in series between said first and second potentials and generates said first and second reference potentials on the basis of the voltages divided by the resistance ratios of these resistors.

6. A MOS integrated circuit according to claim 3, wherein said node stabilization circuit further includes:

a first capacitor connected between said first potential and said second reference potential node;

a second capacitor connected between said second reference potential node and said first reference potential node; and a third capacitor connected between said first reference potential node and said second potential.

7. A MOS integrated circuit according to claim 3, wherein said first and second reference potentials are supplied from an external source.

8. A MOS integrated circuit according to claim 3, wherein said first operation circuit includes a first clock driver circuit having first clock buffer circuits and distributing a first clock signal, said second operation circuit includes a second clock driver circuit having second clock buffer circuits and distributing a second clock signal, and said first clock signal supplied by said first clock driver circuit is complementary to said second clock signal supplied by said second clock driver circuit.

9. A MOS integrated circuit according to claim 8, wherein said first clock buffer circuits of said first clock driver circuit include a first level conversion circuit for converting an input signal having an amplitude between said first potential and said second potential into a signal having an amplitude between said first potential and said middle potential, and a second level conversion circuit coupled to said first level conversion circuit for converting said signal having an amplitude between said first potential and said middle potential into a signal having an amplitude between said first potential and said second potential, and said second clock buffer circuits of said second clock driver circuit include a third level conversion circuit for converting said input signal having an amplitude between said first potential and said second potential into a signal having an amplitude between said middle potential and said second potential, and a fourth level conversion circuit coupled to said third level conversion circuit for converting said signal having an amplitude between said middle potential and said second potential into a signal having an amplitude between said first potential and said second potential.

10. A MOS integrated circuit according to claim 8, wherein said first clock driver circuit and said second clock driver circuit have the same number of clock buffer circuits, and first clock buffer circuits of said first clock driver circuit and second clock buffer circuits of said second clock driver circuit have the same driving capability.

11. A MOS integrated circuit according to claim 10, wherein said clock buffer circuits of said first clock driver circuit and said clock buffer circuits of said second clock driver circuit are laid out adjacent to each other.

12. A MOS integrated circuit according to claim 1, wherein said middle potential is supplied to a middle potential wire which is disposed at the boundary between the first and second operation circuits.

13. A MOS integrated circuit according to claim 1, wherein each of said operation circuits include a substrate potential supply circuit for switching a plurality of potentials on the basis of a signal inputted from outside and supplying a potential to a substrate of a transistor of one of said first and second operating circuits whose source receives the middle potential.

14. A MOS integrated circuit operating on a first potential and a second potential, the first potential being larger than the second potential and being externally supplied, comprising:

a middle potential node to be provided with a middle potential between said first potential and said second potential;

a first operation circuit including a circuit operating between said first potential and said middle potential;

a second operation circuit including a circuit operating between said middle potential and said second potential; and a node stabilization circuit for supplying and stabilizing the potential of said middle potential node, wherein said node stabilization circuit includes:

a reference potential node to which a reference potential is to be supplied having a value between said first potential and said second potential and for determining said middle potential; and a comparison means for comparing said reference potential with said middle potential, and which operates to discharge said middle potential node when said middle potential is higher than said reference potential and to charge said middle potential node when said middle potential is lower than said reference potential.

15. A MOS integrated circuit according to claim 14, wherein said node stabilization circuit further includes a first capacitor connected between said first potential and sad middle potential and a second capacitor connected between said second potential and said middle potential node.

16. A MOS integrated circuit according to claim 14, wherein said node stabilization circuit includes a plurality of resistors connected in series between said first and second potential and generates said reference potential on the basis of the voltages divided by the resistance ratios of these resistors.

17. A MOS integrated circuit according to claim 16, wherein said node stabilization circuit includes a first capacitor connected between said first potential and said reference potential node and a second capacitor connected between said reference potential node and said second potential.

18. A MOS integrated circuit according to claim 14, wherein said reference potential is to be supplied from an external source.

19. A MOS integrated circuit operating on a first potential and a second potential, the first potential being larger than the second potential and being externally supplied, comprising:

a middle potential node to be provided with a middle potential between said first potential and said second potential;

a first operation circuit including a circuit operating between said first potential and said middle potential;

a second operation circuit including a circuit operating between said middle potential and said second potential; and a node stabilization on circuit for supplying and stabilizing the potential of said middle potential node, wherein said first operation circuit includes a first clock driver circuit having clock buffer circuits and distributing a first clock signal, said second operation circuit includes a second clock driver circuit having clock buffer circuits and distributing a second clock signal, and said first clock signal supplied by said first clock driver circuit is complementary to said second clock signal supplied to said second clock driver circuit.

20. A MOS integrated circuit according to claim 19, wherein said clock buffer circuits of said first clock driver circuit include a first level conversion circuit for converting an input signal having an amplitude between said first potential and said second potential into a signal having an amplitude between said first potential and said middle potential, and a second level conversion circuit coupled to said first level conversion circuit for converting said signal having an amplitude between said first potential and said middle potential into a signal having an amplitude between said first potential and said second potential, and said clock buffer circuits of said second clock driver circuit include a third level conversion circuit for converting said input signal having an amplitude between said first potential and said second potential into a signal having an amplitude between said middle potential and said second potential, and a fourth level conversion circuit coupled to said third level conversion circuit for converting said signal having an amplitude between said middle potential and said second potential into a signal having an amplitude between sad first potential and said second potential.

21. A MOS integrated circuit according to claim 19, wherein said first clock driver circuit and said second clock driver circuit have the same number of clock buffer circuits, and said clock buffer circuits of said fist clock driver circuit and said clock buffer circuits of said second clock driver circuit have the same driving capability.

22. A MOS integrated circuit according to claim 21, wherein said clock buffer circuits of said first clock driver circuit and said clock buffer circuits of said second clock driver circuit are laid out adjacent to each other.

23. A MOS integrated circuit operating on a first potential and a second potential, the first potential being larger than the second potential and being externally supplied, comprising:

a middle potential node to be provided with a middle potential between said first and second potentials;

a first operation circuit including a circuit operating between said first potential and said middle potential and connected to said middle potential node;

a second operation circuit including a circuit operating between said middle potential and said second potential and connected to said middle potential node; and a node stabilization circuit for supplying and stabilizing the potential of said middle potential node, wherein said first operation circuit has a first bit section for operating n bits (1<n <N−1) of a function block with a multi-bit structure having N bits (N: natural number), and said second operation circuit has a second bit section for operating m bits (m=N−n) of said function block.

24. A MOS integrated circuit according to claim 23, wherein said first bit section and said second bit section have the same quantity of bits (n=m, N: even number).

25. A MOS integrated circuit according to claim 23, wherein said function block includes a bus driver.

26. A MOS integrated circuit according to claim 23, wherein said function block includes a memory.

27. A MOS integrated circuit according to claim 23, wherein said function block includes a datapath section.

28. A MOS integrated circuit according to claim 24, wherein said first bit section and said second bit section are divided into a plurality of portions, portions of said first bit section and portions of said second bit section are alternately laid and a middle potential wire is disposed at the boundary between the portion of said first bit section and the portion of said second bit section.

29. A MOS integrated circuit operating on a first potential and a second potential, the first potential being larger than the second potential and being externally supplied, comprising:

a plurality of middle potential nodes to which a plurality of middle potentials having different levels with respect to each other and between said first potential and said second potential are to be supplied respectively;

a plurality of operation circuits each of which includes a circuit operating between two potentials selected from the group consisting of said first potential, said second potential, and said plurality of middle potentials; and a plurality of node stabilization circuits each of which is connected between said plurality of operation circuits respectively for supplying and stabilizing the potential of respective middle potential node of said plurality of said middle potential nodes.

30. A MOS integrated circuit according to claim 29, wherein each node stabilization circuit of said plurality of node stabilization circuits includes:

reference potential nodes each supplied with a respective reference potential among a plurality of reference potentials having values between said first potential and second potential respectively for determining said middle potentials; and comparison means for comparing said reference potentials with said middle potential, and operating to discharge the middle potential node when said middle potential is higher than said reference potential of said plurality of reference potentials and to charge the middle potential node when said middle potential is lower than said reference potential.

31. A MOS integrated circuit according to claim 30, wherein each node stabilization circuit includes a plurality of resistors connected in series between said first and second potentials and generates said plurality of reference potentials on the basis of the voltages divided by the resistance ratio of these resistors.

32. A MOS integrated circuit according to claim 30, wherein the plurality of reference potentials is to be supplied from an external source.

33. A MOS integrated circuit according to claim 29, wherein each node stabilization circuit of said plurality of node stabilization circuits includes capacitors connected between said first and second potentials.

34. A MOS integrated circuit according to claim 29, wherein at least one middle potential of said middle potentials is to be supplied from an external source.

35. A MOS integrated circuit operating on a first potential and a second potential, the first potential being larger than the second potential and being externally supplied, comprising:

a middle potential node to be provided with a middle potential between said first potential and said second potential;

a first operation circuit including a circuit operating between said first potential and said middle potential;

a second operation circuit including a circuit operating between said middle potential and said second potential; and a node stabilization circuit for supplying and stabilizing the potential of said middle potential node, wherein the first operation circuit includes a first substrate potential supply circuit for switching a plurality of potentials on the basis of a signal inputted from outside and supplying the potential to a substrate of an N-channel transistor whose source receives the middle potential, and the second operation circuit includes a second substrate potential supply circuit for switching a plurality of potentials on the basis of a signal inputted from outside and supplying a potential to the substrate of a P-channel transistor whose source receives the middle potential.

36. A MOS integrated circuit according to claim 35, wherein the second substrate potential supply circuit supplies said middle potential to the substrate of the P-channel transistor when the first substrate potential supply circuit supplies said middle potential to the substrate of the N-channel transistor, and the second substrate potential supply circuit supplies the first potential to the substrate of the P-channel transistor when the first substrate potential supply circuit supplies the second potential to the substrate of the N-channel transistor.

* * * * *